United States Patent
Hanawa et al.

(10) Patent No.: US 8,211,727 B2
(45) Date of Patent: Jul. 3, 2012

(54) GROUP III NITRIDE SEMICONDUCTOR MULTILAYER STRUCTURE AND PRODUCTION METHOD THEREOF

(75) Inventors: Kenzo Hanawa, Ichihara (JP); Yasumasa Sasaki, Tokyo (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/057,696

(22) PCT Filed: Jul. 30, 2009

(86) PCT No.: PCT/JP2009/063902
§ 371 (c)(1),
(2), (4) Date: Mar. 8, 2011

(87) PCT Pub. No.: WO2010/016532
PCT Pub. Date: Feb. 11, 2010

(65) Prior Publication Data
US 2011/0147763 A1    Jun. 23, 2011

(30) Foreign Application Priority Data
Aug. 6, 2008    (JP) .................................. 2008-203429

(51) Int. Cl.
*H01L 21/00* (2006.01)
(52) U.S. Cl. ............... 438/47; 438/46; 438/93; 438/94; 438/96; 438/97; 438/285; 438/483; 438/488
(58) Field of Classification Search .................. 438/47, 438/46, 93, 94, 96, 97, 285, 483, 488
See application file for complete search history.

(56) References Cited

U.S. PATENT DOCUMENTS

| | | | |
|---|---|---|---|
| 6,015,979 | A | 1/2000 | Sugiura et al. |
| 6,790,279 | B2 | 9/2004 | Koike et al. |
| 2001/0013605 | A1 | 8/2001 | Umezaki et al. |
| 2003/0162340 | A1 | 8/2003 | Tezen |
| 2005/0118825 | A1 | 6/2005 | Nishijima et al. |

FOREIGN PATENT DOCUMENTS

| | | |
|---|---|---|
| JP | 2000-21789 A | 1/2000 |
| JP | 2000-323417 A | 11/2000 |
| JP | 2001-156403 A | 6/2001 |
| JP | 2001-267242 A | 9/2001 |
| JP | 2002-305356 A | 10/2002 |
| JP | 2003-252700 A | 9/2003 |
| WO | 2008/081717 A1 | 7/2008 |

*Primary Examiner* — Long Pham
(74) *Attorney, Agent, or Firm* — Sughrue Mion, PLLC

(57) ABSTRACT

According to the present invention, an AlN crystal film seed layer having high crystallinity is combined with selective/lateral growth, whereby a Group III nitride semiconductor multilayer structure more enhanced in crystallinity can be obtained. The Group III nitride semiconductor multilayer structure of the present invention is a Group III nitride semiconductor multilayer structure where an AlN crystal film having a crystal grain boundary interval of 200 nm or more is formed as a seed layer on a C-plane sapphire substrate surface by a sputtering method and an underlying layer, an n-type semiconductor layer, a light-emitting layer and a p-type semiconductor layer, each composed of a Group III nitride semiconductor, are further stacked, wherein regions in which the seed layer is present and is absent are formed on the C-plane sapphire substrate surface and/or regions capable of epitaxial growth and incapable of epitaxial growth are formed in the underlying layer.

17 Claims, 6 Drawing Sheets

5nm

Fig. 5
(a)
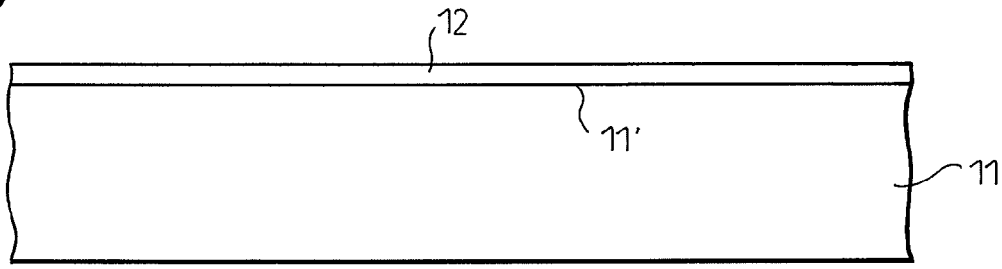
(b)
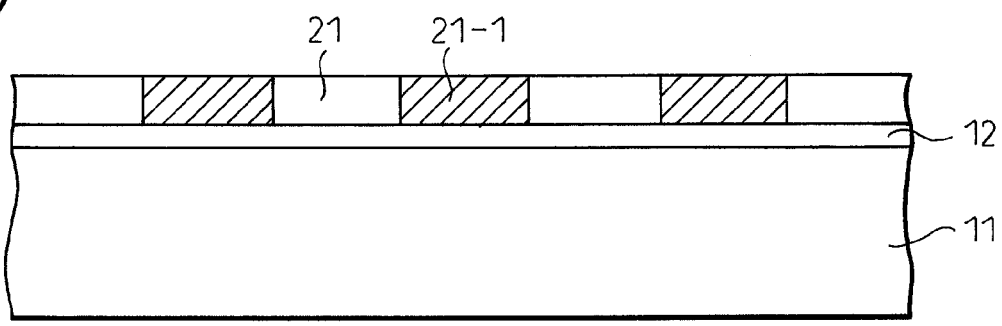
(c)
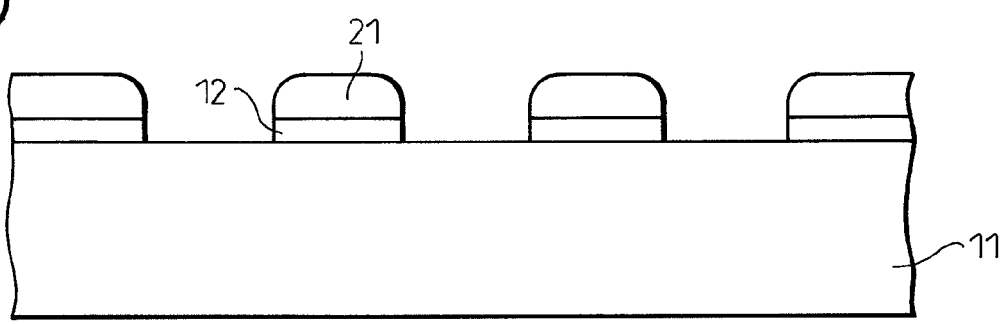
(d)
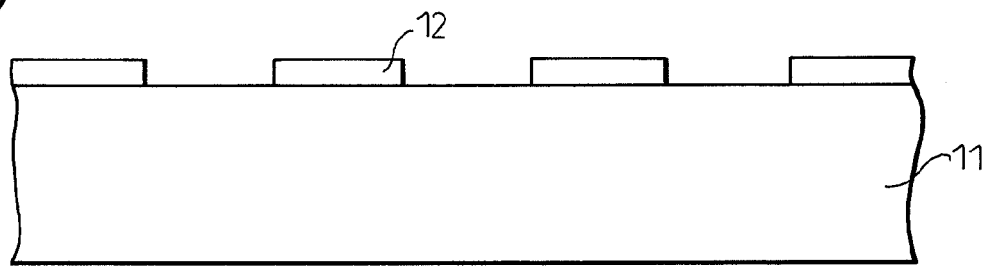

GROUP III NITRIDE SEMICONDUCTOR MULTILAYER STRUCTURE AND PRODUCTION METHOD THEREOF

TECHNICAL FIELD

The present invention relates to a Group III nitride semiconductor multilayer structure and a production method thereof.

BACKGROUND ART

It is very difficult for Group III nitride semiconductors GaN, AlN, InGaN and AlGaN to grow into a large-sized bulk single crystal, and therefore, heteroepitaxial growth using sapphire as the substrate has been generally employed. However, a lattice mismatch of 11 to 23% and a thermal expansion coefficient difference of up to $2\times10^{-6}/°$ C. are present between Group III nitride semiconductors and sapphire. Also, because of difference in chemical properties, a Group III nitride semiconductor epitaxial film directly grown on sapphire only partially inherits the properties as a single crystal of the substrate and grows three-dimensionally, and this is thought to make it significantly difficult to maintain a flat surface profile. It is necessary that the substrate on which a GaN single crystal film is grown have, heat resistance up to 1,200° C. and no reaction with $NH_3$ at that temperature. In this respect, only sapphire and SiC are currently available as a substrate which is producible at practical cost. Of these, sapphire is overwhelmingly advantageous from a cost comparison view-point, and 90% or more of the GaN-based light-emitting device (LED) actually produced in the world employs a sapphire substrate. However, sapphire and GaN differ in the lattice constant and thermal expansion coefficient and further in the chemical properties, and therefore direct growth of a GaN single crystal is believed to be impossible. Consequently, despite various modifications and vast improvements made in a GaN-based light-emitting device formed on a sapphire substrate, a fairly high number of defects occur on the inside, and there is a limit to sufficiently enhancing the luminous efficiency and element lifespan.

Generally, the method for obtaining a single crystal film having good crystallinity by heteroepitaxial growth with a large lattice mismatch includes the following two ways.

(i) Growth through a material having physical constants intermediate between the substrate and the epitaxial film, whereby the quality of the epitaxial film can be enhanced. That is, a thin film having intermediate properties in terms of lattice constant, chemical properties, thermal expansion coefficient and the like is interposed. In this case, a single-crystal thin film must be inserted, because the properties of the single crystal substrate are desired to be inherited by a single crystal as directly as possible.

(ii) Interpose a polycrystalline or amorphous film formed of the same material as that of the objective single crystal thin film. The film above is usually formed by a method of depositing a film at a temperature lower than the single crystal growth temperature (Kokoku (Japanese Examined Patent Publication) No. 62-29397). Epitaxial growth of SOS (silicon on sapphire substrate) or the like was first studied, which results in a low-temperature buffer layer for GaN on a sapphire substrate. The mechanism is based on the fact that GaN yields a high nucleation density on the buffer layer, generation of a grain boundary is inhibited due to selective growth/coalescence of only crystal grains well-aligned in the crystal orientation out of the crystal grains, and flattening is achieved by utilizing a higher rate of growth in the lateral growth direction on the buffer layer (see, for example, Isamu Akazaki, et al., *Journal of the Japanese Association for Crystal Growth*, Vol. 13, No. 4, 1986, pp. 218-225; Vol. 15, No. 3-4, 1988, pp. 334-342; and Vol. 20, No. 4, 1993, pp. 346-354).

Trend (i) means that the quality of an epitaxial film can be enhanced by performing the growth through a material having physical constants intermediate between the substrate and the epitaxial film. Accordingly, growth via an AlN layer is considered to be effective for growing a GaN layer on a sapphire substrate. Since, the lattice constant and thermal expansion coefficient of AlN are intermediate between sapphire and GaN and therefore, lattice mismatch and thermal distortion are efficiently moderated. In addition, AlN and GaN are close in the chemical properties, and the interfacial energy therebetween is also small. In other words, this may be understood as follows. Sapphire, i.e., $Al_2O_3$, is an oxide, and the most chemically similar nitride is AlN having Al in common. The lattice mismatch is 11% and relatively high, but by having Al in common, an AlN single crystal is liable to grow. Moreover, since AlN is the only compound allowing 100 percent solid solution of GaN, the chemical properties are closest to each other and the lattice mismatch is only 2%. Accordingly, even though direct growth of $Al_2O_3/GaN$ may be difficult, when AlN is inserted as in $Al_2O_3/AlN/GaN$, a GaN single crystal can be grown while inheriting the crystallinity of sapphire ($Al_2O_3$). So, once a flat AlN layer can be formed directly as a single crystal, the GaN film quality of heteroepitaxial film grown thereon can be remarkably enhanced.

The following three methods are known to deposit an AlN film for this purpose.

I. A method of heat-treating a sapphire substrate in a nitrogen source gas atmosphere such as $NH_3$, $N_2H_2$ and organic amine, thereby converting the substrate surface into single crystal AlN (Kokoku No. 7-54806), or a chemical vapor deposition method of vapor-depositing Al in an $NH_3$ or $N_2H_2$ atmosphere (Kokoku No. 59-48796).

II. A method of supplying an aluminum source gas such as organic aluminum, halogenated aluminum and metal aluminum vapor, and a nitrogen source gas onto a sapphire substrate kept at a high temperature allowing for single crystal growth of AlN, to deposit a single crystal AlN layer (Kokai (Japanese Unexamined Patent Publication) No. 9-64477), where a high temperature of about 1,300° C. is required.

III. A method of supplying an aluminum source gas and a nitrogen source gas at a low temperature of 500 to 1,000° C. to deposit a polycrystalline or amorphous AlN layer of several hundreds to 1,000 Å, and annealing it at a higher temperature, thereby forming a single crystal (Kokoku No. 4-15200 and Kokai No. 5-41541).

Regarding method I above, in the case of surface nitriding, a nitride layer of several tens of Å can be formed with good reproducibility and moreover, formation of this single crystal AlN layer involves a gradient compositional change, so that the lattice mismatch can be effectively moderated to a region of only several tens of Å. In the chemical vapor deposition, an ultrahigh vacuum of $10^{-8}$ Torr is required, and Al vapor and $NH_3$ or $N_2H_2$ are reacted on a substrate at a high temperature of 1,000 to 1,200° C. However, the AlN layer formed by such a method does not result in a nitriding reaction to uniformly proceed and may have surface roughness on the order of 10 Å. When epitaxial growth is performed on the surface-roughened AlN layer, the irregularities are exaggerated with an increase in the film thickness and a flat surface profile cannot be obtained.

On the other hand, in the AlN layer formed by the method II, uniform and fine growth nuclei cannot be generated simultaneously due to film growth at a high temperature, but sequential generation of nuclei results and therefore, three-dimensional growth is unavoidable. Ito et al. have stated that a GaN crystal with smooth surface cannot be obtained unless the mechanism used in the low-temperature buffer works, i.e., the mechanism where uniform and fine polycrystals are produced simultaneously while inhibiting single crystal growth by reducing the flow rate of $NH_3$ as much as possible even when growing AlN at a high temperature and a smooth surface is created by promoting the lateral growth (*J. Crystal Growth*, 205 (1999), pp. 20-24).

In this way, the single crystal AlN layer formed by the methods I and II has a certain effect in improving the crystallinity of the epitaxial film grown thereon and enhancing the optical characteristics such as PL (photoluminescence), but three-dimensional growth is promoted to create an irregular surface which makes it difficult to obtain an epiwafer enabling fabrication of an LED device that is reliable even when current flows.

In the method III, an AlN film is deposited at such a low temperature that no three-dimensional growth occurs, so that a flat amorphous layer can be formed. However, annealing the single crystal formation involves a minute difference in the orientation between the first crystallized portion and the later crystallized portion and therefore, the surface begins to become disordered. When a GaN epitaxial film is grown thereon, irregularities are gradually produced.

As described above, the method of using a single crystal AlN seed layer with intermediate physical constants in the heteroepitaxial growth of growing a GaN single crystal on a sapphire substrate has been studied but has stopped at present due to not being able to maintain surface flatness.

Therefore, a buffer layer in trend (ii) instead of (i) above is currently being employed. In use as a buffer layer, it is meaningless to have intermediate physical constants, and the basic practice is to use a microcrystalline or amorphous thin film having the same composition as that of the single crystal intended to grow. For this reason, a low-temperature buffer method using, as the buffer, a layer formed by depositing a GaN film at a low temperature near 500° C. is being most widely employed.

Meanwhile, a sputtering method has long been studied as the method for obtaining an AlN film with a uniform thickness. A. J. Shuskus et al. have reported as follows (*Applied Physics Letters*, Vol. 24, No. 4 (1974), pp. 155-156). That is, a high-purity Al target was subjected to RF discharge in $NH_3$ gas by using a reaction vessel capable of reaching a vacuum of $10^{-8}$ Torr, and an AlN film was deposited on a (0001) plane sapphire substrate at 1,200° C., whereby a single crystal thin film as measured with reflective electron beam analysis could be formed. However, the obtained AlN film exhibits only one kind of pattern in the reflection electron beam diffraction, and they are silent on the absence of columnar crystal grain boundary and the surface properties. After that, C. R. Aita et al. formed an AlN thin film on single crystal Si at room temperature by using a high-purity Al target and discharging a mixed gas of Ar and $N_2$ and closely examined the discharge conditions and the quality of the film deposited (*J. Appl. Phys.*, Vol. 53, No. 3 (1982), pp. 1807-1809, *J. Vac. Sci. Technol. A*, Vol. 1, No. 2 (1983), pp. 403-406). Also, W. J. Meng et al. performed an experiment in which a film was deposited on Si(111) and Si(100) substrates under the same conditions by raising the temperature to 600° C. or more and have reported that an AlN thin film having a very fine smooth polycrystalline surface whose orientation is aligned with the C-plane was formed on both substrates (*J. Appl. Phys.*, Vol. 75, No. 7 (1994), pp. 3446-3455). Despite subsequent various discussions on its application as a compound semiconductor, this falls short of being practical, because the energy gap of AlN is as large as 6.2 eV.

A high-energy electron flow is produced upon plasma generation and when the electron is implanted into a crystal, a defect called plasma damage is created in the crystal. Therefore, a sputtering method has not been actively used in the semiconductor application where a thin-film crystal reduced in the defect as much as possible is required. However, since a sputtering method is a very excellent method for depositing a thin film of several tens to several hundreds of Å with good reproducibility and becomes widespread through its proven performance in stably mass-producing a highly functional thin film as a thin-film multilayer in the Si semiconductor wiring process or in the field of hard disk media or head, the sputtering method is now aggressively studied. The AlN film formed by the sputtering method is amorphous or polycrystalline in many cases, and there are a very few reports where a single crystal film is deposited. In particular, as implied by the term "plasma damage", it is generally believed that when a single crystal is exposed to plasma, the crystal is damaged. In this way, the sputtering method is a highly advantageous method as the method of depositing a film while maintaining the substrate flatness but is seldom considered as the method for raising the crystallinity.

On the other hand, the low-temperature buffer approach is based on the fact that uniform and fine polycrystal nuclei generate simultaneously to allow coalescence of only crystals aligned in the orientation, where a flat single crystal can be formed by utilizing the lateral growth. Therefore, a polycrystalline or amorphous thin film needs to be uniformly deposited. In this connection, use of AlN in the sputtering method of film-depositing a low-temperature buffer has emerged as one approach. That is, an amorphous AlN or GaN film is deposited by reaction sputtering using an Al or Ga target and after once removing the film from the apparatus, GaN is grown by MOCVD (Kokai Nos. 2000-286202, 2001-94150 and 60-173829).

In 1972, Cuomo et al. succeeded in depositing a polycrystalline thin film aligned in the GaN orientation by reaction sputtering using a Ga target for a sapphire substrate (*Appl. Phys. Lett.*, Vol. 20, No. 2 (1972), pp. 71-72, and Kokai No. 48-40699), and furthermore, by developing this technique, a method of producing a buffer layer and an underlying layer by sputtering has been proposed (U.S. Pat. Nos. 6,692,568 and 6,784,085, and Kohyo (National Publication of Translated Version) No. 2004-523450), where a large number of columnar crystals are generated on a substrate and a single crystal GaN thin film is obtained on the columnar crystals by utilizing the lateral growth, i.e., by modifying the apparatus or varying the conditions such as ratio of Ar to $N_2$ and discharge power, to allow coalescence of only crystals substantially aligned in the orientation out of the columnar crystals (see, for example, FIG. 4 of U.S. Pat. No. 6,692,568).

A technique of partially creating a portion disallowing growth and promoting the lateral growth, thereby improving the crystallinity, is known as the high crystallization technique for heteroepitaxial growth. Production of a crystal with a low defect density has been attempted by applying this technique to a GaN single crystal thin film, and successful results have been achieved.

I. Before Application to GaN-Based Semiconductor Laser Diode (LD)

As the method for growing a crystal such as GaAs on an Si substrate, the following publications are disclosed before the technique of growing GaN on a sapphire substrate is spread.

Kokai No. 57-115849 is characterized by comprising the following steps (α) to (δ) and includes the selective/lateral growth concept. In the Examples, GaAs is grown on an Si substrate.

(α) A step of performing epitaxial growth on a substrate, (β) a step of patterning the epitaxial growth layer in a grid, channeled or dot fashion by photoetching, (γ) a step of again performing epitaxial growth on the substrate, and (δ) a step of polishing the substrate to flatten the epitaxial layer.

Kokoku No. 06-105797 describes a semiconductor substrate with a compound semiconductor epitaxial growth layer, comprising a compound semiconductor substrate having on the surface thereof an insulator thin film or high melting point metal thin film in which a plurality of window parts are partially provided, wherein the substrate portion exposed in the window part of the thin film is used as a seed and a portion continuously grown from the seed part in the direction parallel to the substrate surface is joined and integrated with an epitaxial growth portion grown from the adjacent seed part, and this technique includes selective growth/lateral growth.

Kokai No. 04-127521 describes a technique of forming an $SiO_2$ mask on a GaAs substrate and growing InGaAs by liquid-phase epitaxial growth.

Kokai No. 04-303920 describes a technique of forming an $SiO_2$ mask on an Si substrate and laterally growing GaAs through growth by MOCVD. It is disclosed that since defects are decreased on the mask but not decreased in the mask-free portion, a mask is again formed when flattening can be achieved, and GaAs is grown thereon.

II. Development of Application to GaN-Based Semiconductor LD

A GaN-based LED having a double heterostructure using a quantum well structure was fabricated in 1996 and since then, leading-edge development was focused on LD. A blue LED whose output at 20 mA exceeds 5 mW was deemed as having ultrahigh luminance at that time, but when the crystallinity was evaluated by the threading dislocation density, the crystal was in a level allowing threading dislocations to exist at a density of about $10^{+9}/cm^2$ and the dislocation density was four-digit higher than that of the crystal used in GaAs-based LED. In LD fabrication laser oscillation is not easily confirmed. In the case of LD, a larger number of defects leads to a higher threshold current oscillated, and a higher threshold current gives rise to a higher evolution of useless heat. Continuous oscillation for a long time is required in practical use and for this purpose, the threshold current needs to be greatly reduced. Good crystallinity is essential for reducing the threshold current. The theory that luminous efficiency of an LED, does not change even when the crystallinity is increased (*Science* 14 Aug. 1998, Vol. 281, No. 5379, pp. 951-956) is widely accepted, and the focus of research has shifted to increasing the light collection efficiency, but in order to finalize the fabrication of LD, an increase in crystallinity is necessary, and hence so-called "selective/lateral growth method" is drawing attention as a method therefor.

It was reported by Y. Kato et al. in 1994 that when a part of the growth surface for GaN in MOCVD is masked with $SiO_2$ and so-called "selective growth" occurs, a {1-101} plane facet appears in a window in the <11-20> direction (*JCG*, 144 (1994), 133-140).

Furthermore, a dot pattern of hexagonal pyramid surrounded by six {1-101} planes was grown on sapphire by them (*JJAP,* 34 (1995), L1184-L1186). These techniques are not aimed at increasing the crystallinity, but the process is selective/lateral growth and is positioned as the starting point for selective/lateral growth in the GaN-based semiconductor.

In 1997, A. Usui et al. formed a crystal having a threading dislocation density of $6 \times 10^{+7}$ $cm^2$ by putting an $SiO_2$ mask on a part of the sapphire/LTGaN buffer/GaN surface and growing GaN of 30 μm or more in thickness by the HPVE method. The crystal was taken out during growth and observed with SEM, and the process of a facet being created in the early time of growth and gradually filled was thereby confirmed (*JJAP,* 36 (1997), L899-L902). Subsequently, it was confirmed by TEM observation that in the course of filling the facet after its creation, the threading dislocation is bent to the direction parallel to the substrate surface and the number of dislocations is decreased when filling of the facet is finished (*APL,* 71 (1997), 2259-2261; *APL,* 73 (1998), 481-483).

R. Davis et al. caused lateral growth to proceed by putting an $SiO_2$ mask on SiC substrate/AlN buffer/GaN and forming a striped window and in 1997, reported that when the cross-section was observed by TEM, only a few dislocations were present on $SiO_2$ but numerous dislocations were observed in a portion without $SiO_2$. In this case, the growing process utterly differs between the window direction being <11-20> direction and being <1-100> direction, and in the <11-20> direction, a {1-101} plane facet is finished to give a triangular cross-section, but in the <1-100> direction, the cross-section shows a rectangular profile defined by the (0001) plane as the top surface and the {11-20} plane as the side surface (*APL,* 71 (1997), 2638). Also, it is indicated that as the gas pressure during growth is higher, as the area ratio of the mask is smaller, and as the TEG concentration is higher, the {1-101} plane facet is more readily created (*JJAP,* 36 (1997), L532). In 1999, the group lead by the professor R. Davis above proposed a selective/lateral growth method called a PENDEO method (*J. NSR,* 4S1, (1999), G3, No. 38, and *APL,* 75 (1999), 196). This is an approach of mainly growing the {11-20} plane. After preparing SiC/AlN buffer/GaN, a film obtained by stacking Ni is used as the mask, the portion with an window open is dug to SiC by etching, and Ni is then removed to grow GaN. GaN is not grown on SiC, and the {11-20} plane of GaN exposed by etching mainly grows. According to the cross-sectional SEM, a space is opened in the portion where AlN buffer/GaN are not present. Laterally grown GaN collides and covers the entire surface and thereafter, the (0001) plane grows. The crystal grows in the space until it collides.

At almost the same time, S. Nakamura et al. increased the performance of LD by applying selective/lateral growth to LD (*Appl. Phys. Lett.*, Vol. 72 (1998), 211, and *Jpn. J. Appl. Phys.*, Vol. 36 (1997), L1568), where the {11-20} plane was grown by forming an $SiO_2$ mask on sapphire/LT GaN buffer/2-μm GaN with an window open in the <1-100> direction. According to this method, the number of dislocations is small on $SiO_2$ but is large in the portion with the window open and therefore, a technique of fabricating an element by selecting a portion having little dislocations is employed. The cleavage plane differs between sapphire and GaN and if the direction having little defects and allowing for fabrication of an element is decided, a plane for laser oscillation cannot be created by cleavage. Therefore, GaN was stacked to a large thickness of 100 μm, and sapphire was shaved off by polishing. That is, a GaN single crystal substrate was formed by selective/lateral growth and an LD structure was grown thereon (*Jpn. J. Appl. Phys.*, Vol. 37 (1998), L309, and *Appl. Phys. Lett.*, Vol. 72 (1998), 2014). As a result, continuous oscillation for 10,000 hours became feasible at room temperature, and sales of this element were announced in 1999. Triggered by this success, it is acknowledged that selective/lateral growth is essential for fabricating ultraviolet/blue LD.

III. Classification of Selective/Lateral Growth Methods

The selective/lateral growth is roughly classified by the portion used for growth and the method for selective growth, into growth aiming at preparation of a GaN single crystal substrate by forming a thick film and removing sapphire, and growth of forming a thin film to raise the crystallinity of the underlying layer.

In applying selective/lateral growth, the method for raising the crystallinity of the underlying layer can be classified by the step of selecting the growth portion, the method for selecting the portion, and the kind of the plane that is preferentially grown when performing lateral growth.

A Step of Selecting the Growth Portion:
($\alpha$) the portion is selected in the sapphire substrate itself,
($\beta$) the portion is selected in the buffer layer, or
($\gamma$) after GaN is once grown, the portion is selected in the GaN surface.

B The Method for Selecting the Portion Includes the Following Three Kinds of Methods:
(a) covering with a mask, and
(b) removal by etching or the like of the plane where a single crystal cannot grow.

C The plane that is preferentially grown when performing lateral growth includes the following two kinds of planes:
(i) a facet oblique with respect to the substrate, such as {1-101} plane, is used; or
(ii) a facet in the direction perpendicular to the substrate, such as {11-20} plane, is used, that is, the crystal is grown in the direction parallel to the substrate.

However, in conventional techniques, crystallinity of the crystal as a basis for selective/lateral growth is not so good, leading to failure in obtaining sufficiently high crystallinity by one selective/lateral growth, and the process is repeated twice or the level usable for LD is not reached.

As described above, the method for heteroepitaxially growing a GaN-based semiconductor on a sapphire substrate includes two ways of thinking, i.e., (i) a method of interposing a single crystal seed layer having intermediate physical and chemical properties, and (ii) a method of forming a buffer layer for simultaneously generating uniform and fine nuclei of a polycrystalline or amorphous material with the same composition as that of the objective single crystal and allowing coalescence/growth of only crystals aligned in orientation, and the method (ii) is spread. A sputtering method has been considered and widely studied as the method for forming a thin film while maintaining flatness of the sapphire substrate. This film is effective as a polycrystalline or amorphous buffer layer, but its use as a flat single crystal seed film has not been studied. Because, the sputtering is generally thought to be unsuitable as the method for forming a single crystal.

As described above, with respect to the method of inserting a single crystal thin layer in keeping with the approach (i), three-dimensional growth cannot be prevented in the conventional methods, and even when the surface roughness of the sapphire substrate is about Ra=0.8 Å, Ra of the thin film formed thereon becomes 10 Å or more. Use of a low-temperature buffer layer allows partial formation of a columnar crystal when the temperature is raised to deposit a GaN-based semiconductor film after film deposition of the buffer layer and therefore, the surface flatness in terms of Ra also becomes 10 Å or more.

In the present invention, unlike the low-temperature buffer layer of the currently predominating trend (ii), a GaN-based crystal is obtained in line with the approach (i) that is little studied at present. The failure in most conventional methods in (i) is ascribable to the fact that surface flatness is largely roughened when an AlN thin film is deposited, compared with the sapphire wafer surface.

As described above, GaN does not grow directly on a sapphire crystal and therefore, an AlN or GaN buffer layer was inserted to reduce the crystal mismatch, whereby a success in growing a remarkably excellent GaN crystal for that time was achieved and the luminescence intensity of LED was enhanced to a practically durable level. As a result, LED using a GaN-based crystal was employed as the backlight of a liquid crystal display for cellular phones and this triggered expansion of the demand therefor at a rate of more than 50% per year. In recent years, studies are proceeding toward using an LED backlight as a backlight for personal computer monitors and TVs which are the same in terms of a liquid crystal display. Then, it has been found that sufficient luminous efficiency and reliability cannot be obtained with conventional crystallinity, and demands for higher crystallinity are increasing. The heteroepitaxial growth includes the following two methods. The first is a method of inserting a single crystal seed layer having intermediate physical and chemical properties, and the second is a method of using a buffer layer allowing for simultaneous generation of uniform and fine polycrystalline or amorphous nuclei of a material having the same composition as that of the single crystal and lateral coalescence of crystals aligned in the orientation. Of these, the method using a low-temperature buffer is currently predominating for GaN-based semiconductors. However, as long as a buffer layer is inserted, the regularly ordered atomic arrangement of the single crystal of the substrate is once broken, or portions differing in the crystallization level are generated due to partial progress of crystallization in the course of heating the low-temperature buffer to the growth temperature, and the flatness of the surface is impaired. Accordingly, high crystallinity required at present is considered to be extremely difficult to achieve.

SUMMARY OF THE INVENTION

Problems to be Solved by the Invention

The present inventors have previously accomplished an invention whose object is to obtain a flat AlN crystal film seed layer having high crystallinity, obtain a highly crystalline GaN-based thin film by using an AlN crystal film seed layer endowed with entirely uniform flat surface particularly even when a large substrate having a diameter of 100 mm or more is used, and obtain a highly reliable high-luminance LED element and the like. As part of this invention, the present invention has been accomplished based on the finding that when the AlN crystal film seed layer is combined with selective/lateral growth, the crystallinity is more enhanced and the luminance can be more improved in use for LED and increased to the level applicable also to LD.

Means to Solve the Problems

In order to solve the above-described problems, the present invention provides the following inventions:

(1) a Group III nitride semiconductor multilayer structure which is a Group III nitride semiconductor multilayer structure where an AlN crystal film having a crystal grain boundary interval of 200 nm or more is formed as a seed layer on a C-plane sapphire substrate surface by a sputtering method and an underlying layer, an n-type semiconductor layer, a light-emitting layer and a p-type semiconductor layer, each composed of a Group III nitride semiconductor, are further stacked, wherein regions in which the seed layer is present and is absent are formed on the C-plane sapphire substrate surface and/or regions capable of epitaxial growth and incapable of epitaxial growth are formed in the underlying layer;

(2) a method for producing a Group III nitride semiconductor multilayer structure, comprising producing a Group III nitride semiconductor multilayer structure where an AlN crystal film having a crystal grain boundary interval of 200 nm or more is formed as a seed layer on a C-plane sapphire substrate surface by a sputtering method and an underlying layer, an n-type semiconductor layer, a light-emitting layer and a p-type semiconductor layer, each composed of a Group III nitride semiconductor, are further stacked, wherein (A) regions in which the seed layer is present and is absent are formed on the C-plane sapphire substrate surface and/or (B) regions capable of epitaxial growth and incapable of epitaxial growth are formed in the underlying layer;

(3) the method for producing a Group III nitride semiconductor multilayer structure as described in (2) above, wherein the seed layer-free region on the C-plane sapphire substrate surface is formed in a stripe or island/sea fashion having periodicity;

(4) the method for producing a Group III nitride semiconductor multilayer structure as described in (2) or (3) above, wherein the seed layer-free region on the C-plane sapphire substrate surface is obtained by growing an AlN crystal film as a seed layer on the C-plane sapphire substrate layer and then removing by etching a part of the AlN crystal film;

(5) the method for producing a Group III nitride semiconductor multilayer structure as described in (2) or (3) above, wherein the seed layer-free region on the C-plane sapphire substrate surface is obtained by forming regions allowing and disallowing the seed layer of the C-plane to grow on the sapphire substrate surface and then growing an AlN crystal film as a seed layer only in the region allowing growth of the seed layer;

(6) the method for producing a Group III nitride semiconductor multilayer structure as described in (5) above, wherein the region disallowing growth of the seed layer is formed using either one of the following methods ($\alpha$) and ($\beta$):

($\alpha$) the C-plane sapphire substrate surface is processed to provide a region in a stripe or island/sea fashion having periodicity and thereby form a plane other than C-plane, and ($\beta$) a region in a stripe or island/sea fashion having periodicity is covered with amorphous $SiO_2$, amorphous silicon nitride or a high melting-point metal.

(7) the method for producing a Group III nitride semiconductor multilayer structure as described in (2) above, wherein the region incapable of epitaxial growth in the underlying layer is formed by either one of the following methods ($\gamma$) and ($\delta$):

($\gamma$) the C-plane sapphire substrate surface is processed to provide a region in a stripe or island/sea fashion having periodicity and thereby form a plane other than C-plane, and ($\delta$) a region in a stripe or island/sea fashion having periodicity is covered with amorphous $SiO_2$, amorphous silicon nitride or a high melting-point metal;

(8) the Group III nitride semiconductor multilayer structure as described in (1) above, wherein the full width at half maximum of the X-ray diffraction rocking curve of (0002) plane and (10-10) of the AlN crystal film are 100 arcsec or less and 1.7° or less, respectively;

(9) the Group III nitride semiconductor multilayer structure as described in (1) or (8) above, wherein the oxygen content in the AlN crystal film is 5 atm % or less;

(10) the Group III nitride semiconductor multilayer structure as described in any one of (1), (8) and (9) above, wherein the sapphire substrate has an off-angle of 0.1 to 0.7°;

(11) the Group III nitride semiconductor multilayer structure as described in (1) above, wherein the sputtering method is an RF sputtering method;

(12) the Group III nitride semiconductor multilayer structure as described in any one of (1) and (8) to (11) above, wherein the AlN crystal film is deposited by a sputtering method by placing the sapphire substrate in plasma;

(13) the Group III nitride semiconductor multilayer structure as described in any one of (1) and (8) to (12) above, wherein the sapphire substrate surface is subjected to an $N_2$ plasma or $O_2$ plasma treatment and then the AlN crystal film is deposited on the sapphire substrate surface;

(14) the Group III nitride semiconductor multilayer structure as described in any one of (1) and (8) to (13) above, wherein the substrate temperature during deposition of the AlN crystal film on the sapphire substrate surface is from 300 to 800° C.;

(15) the Group III nitride semiconductor multilayer structure as described in any one of (1) and (8) to (14) above, wherein the thickness of the AlN crystal film is from 10 to 50 nm;

(16) the Group III nitride semiconductor multilayer structure as described in (15), wherein the thickness of the AlN crystal film is from 25 to 35 nm;

(17) the Group III nitride semiconductor multilayer structure as described in any one of (1) and (8) to (16) above, wherein the diameter of the sapphire substrate is 100 mm or more;

(18) the Group III nitride semiconductor multilayer structure as described in any one of (1) and (8) to (17) above, wherein the full width at half maximum of the X-ray diffraction rocking curve of the p-contact layer as the final p-type semiconductor layer is 60 arcsec or less and 250 arcsec or less on the (0002) plane and the (10-10) plane, respectively;

(19) the Group III nitride semiconductor multilayer structure as described in any one of (1) and (8) to (18) above, wherein the underlying layer is a GaN or AlGaN crystal;

(20) a light-emitting device comprising the Group III nitride semiconductor multilayer structure described in any one of (1) and (8) to (19) above;

(21) the light-emitting device as described in (20) above, wherein a negative electrode and a positive electrode are provided on the n-type semiconductor layer and the p-type semiconductor layer, respectively;

(22) the method for producing a Group III nitride semiconductor multilayer structure as described in any one of (2) to (7) above, wherein the full width at half maximum of the X-ray diffraction rocking curve of the (0002) plane and (10-10) of the AlN crystal film are 100 arcsec or less and 1.7° or less, respectively;

(23) the method for producing a Group III nitride semiconductor multilayer structure as described in any one of (2) to (7) and (22) above, wherein the AlN crystal film is formed by controlling the oxygen content in the AlN crystal film to be 5 atm % or less;

(24) the method for producing a Group III nitride semiconductor multilayer structure as described in any one of (2) to (7), (22) and (23) above, wherein the sapphire substrate has an off-angle of 0.1 to 0.7°;

(25) the method for producing a Group III nitride semiconductor multilayer structure as described in (2) to (7) and (22) to (24) above, wherein the sputtering method is an RF sputtering method;

(26) the method for producing a Group III nitride semiconductor multilayer structure as described in (2) to (7) and (22) to (25) above, wherein the AlN crystal film is deposited by a sputtering method by placing the sapphire substrate in plasma;

(27) the method for producing a Group III nitride semiconductor multilayer structure as described in any one of (2) to (7) and (22) to (26) above, wherein an AlN crystal film having an oxygen content of 5 atm % or less is formed by forming the AlN crystal film under conditions in which a peak assigned to oxygen is not recognized in gas analysis during plasma discharge;

(28) the method for producing a Group III nitride semiconductor multilayer structure as described in any one of (2) to (7) and (22) to (27) above, wherein the sapphire substrate surface is subjected to an $N_2$ plasma or $O_2$ plasma treatment and then the AlN single crystal film is deposited on the sapphire substrate surface;

(29) the method for producing a Group III nitride semiconductor multilayer structure as described in any one of (2) to (7) and (22) to (28) above, wherein the substrate temperature during deposition of the AlN crystal film on the sapphire substrate surface is from 300 to 800° C.;

(30) the method for producing a Group III nitride semiconductor multilayer structure as described in any one of (2) to (7) and (22) to (29) above, wherein the thickness of the AlN crystal film is from 10 to 50 nm;

(31) the method for producing a Group III nitride semiconductor multilayer structure as described in (2) to (7) and (22) to (30) above, wherein the thickness of the AlN crystal film is from 25 to 35 nm;

(32) the method for producing a Group III nitride semiconductor multilayer structure as described in any one of (2) to (7) and (22) to (31) above, wherein the diameter of the sapphire substrate is 100 mm or more;

(33) a lamp comprising the light-emitting device described in (20) or (21) above;

(34) an electronic device having incorporated therein the lamp described in (33) above; and

(35) a mechanical device having incorporated therein the electronic device described in (34).

Effects of the Invention

According to the present invention, an AlN crystal film seed layer having high crystallinity is combined with selective/lateral growth, whereby a Group III nitride semiconductor multilayer structure more enhanced in crystallinity can be obtained.

BRIEF DESCRIPTION OF THE DRAWINGS

FIG. 5 is an outline view schematically showing the case where an AlN crystal film is grown as a seed layer on the C-plane sapphire substrate surface and then a part of the AlN crystal film seed layer is shaved off.

MODE FOR CARRYING OUT THE INVENTION

Figure 1:
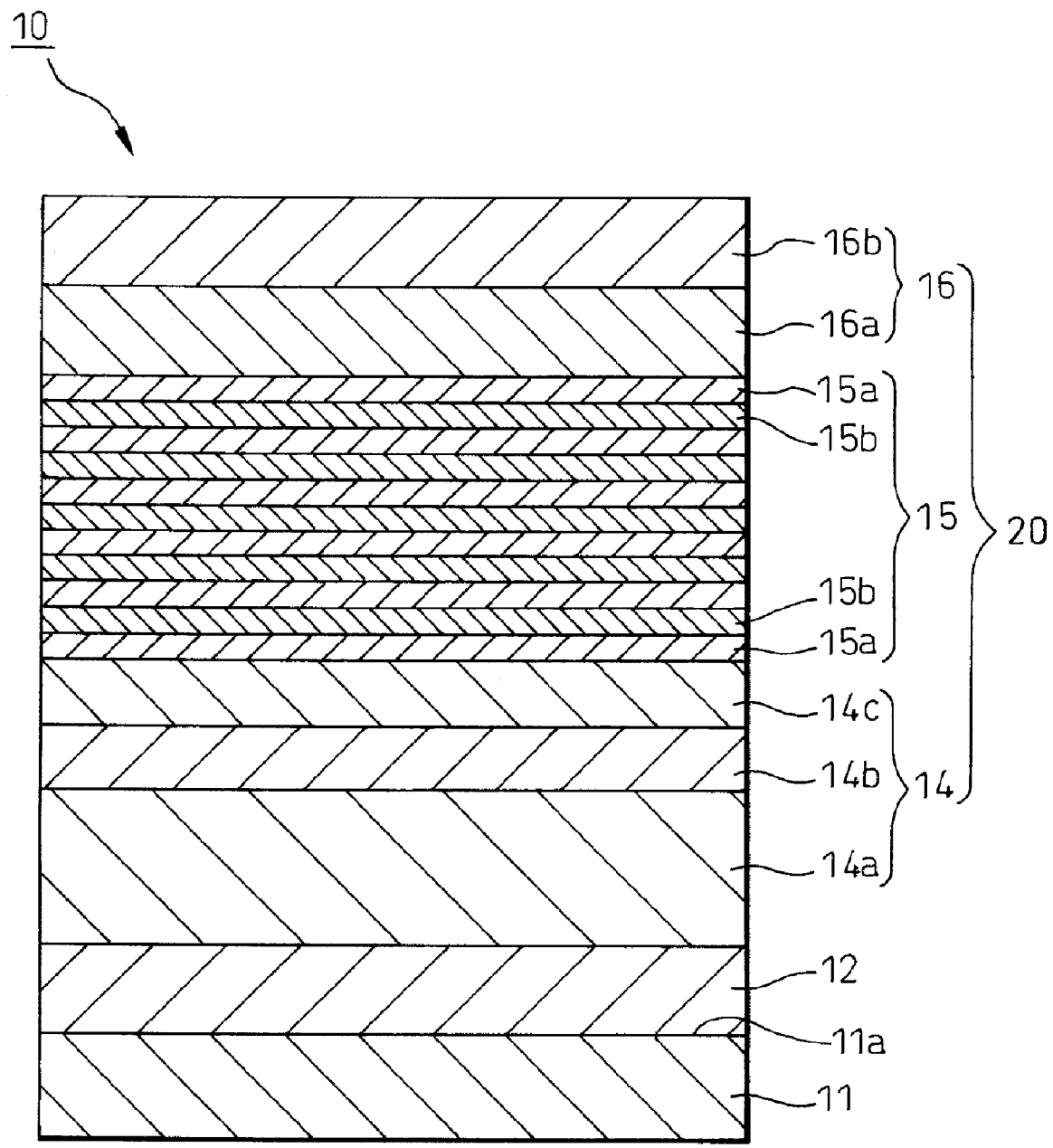
FIG. 1 is a cross-sectional outline view for schematically explaining an example of the Group III nitride semiconductor multilayer structure of the present invention.

Preferred embodiments of the present invention are described below by appropriately referring to FIGS. 1 to 4. The Group III nitride semiconductor multilayer structure (10) of the present invention is obtained by stacking an n-type semiconductor layer (14), a light-emitting layer (15) and a p-type semiconductor layer (16), each composed of a Group III nitride semiconductor, on a sapphire substrate (11), wherein an AlN crystal film is formed as a seed layer (12) on the surface (11a) of the sapphire substrate (11) and in the AlN crystal film, no crystal grain boundary is observed in the observation field of at least 200 nm in the direction parallel to the substrate of the longitudinal cross-sectional TEM (transmission electron microscope) photograph, that is, the interval between crystal grain boundaries is 200 nm or more. The longitudinal cross-sectional TEM as used herein is a TEM image observing the surface perpendicular to the substrate surface, and the planar TEM is a TEM image observing the surface parallel to the substrate surface.

The Group III nitride semiconductor is preferably a GaN-based semiconductor such as GaN, AlN, InGaN and AlGaN (hereinafter, sometimes simply referred to as "GaN" or "GaN-based semiconductor").

In the Group III nitride semiconductor multilayer structure of the present invention, as for the AlN crystal film, no crystal grain boundary is observed in at least a 200 nm-square observation field of its planar TEM photograph, that is, the interval between crystal grain boundaries is 200 nm or more, and it is more preferred that no crystal grain boundary is observed in at least a 500 nm-square observation field.

The longitudinal cross-sectional TEM photograph or planar TEM photograph is obtained by preparing a sample by focused ion beam (FIB) processing and after ion thinning, observing the sample through a high-resolution transmission electron microscope UHR-TEM (H-9000UHR) (manufactured by Hitachi, Ltd.) at an accelerating voltage of 200 kV.

In the X-ray analysis, the average defect density over a wide range of the entire thin film is quantitatively determined. In contrast, transmission electron microscope (Transparent Electron Microscopy) is a method of directly observing crystal defects. This method includes a method of observing crystal defects from the direction perpendicular to C-plane (planar TEM) and a method of observing the direction parallel to that plane ((longitudinal) cross-sectional TEM). In the cross-sectional TEM, when the electron beam incident direction is assigned to the <11-20> direction in a high-resolution mode, a lattice image of the (0001) plane can be viewed. One point in the lattice image corresponds to an atom row, and a "point defect" with a single atom flaw cannot be observed in TEM. The portion with lattice image shifting indicates a single missing plane and corresponds to a dislocation. If a clear grain boundary is present and the plane direction is bent in a completely different direction, the lattice image should break at that point. In 1991, Hiramatsu et al. examined in detail the cross-sectional TEM of sapphire/AlN/GaN formed by deposition through an AlN low-temperature buffer and reported that the AlN layer is an aggregate of columnar crystals (*J.*

*Crystal Growth*, 115 (1991), 628-633). The boundary face between a columnar crystal and a columnar crystal is not a distinct grain boundary and allows both lattice images to be seen, but closer inspection reveals that the lattice image is shifted and in some portions, shifted along the C-axis direction and the image in a bright field differs in the density between both sides of the shift. A grain boundary is unobservable in the present invention, and this means that a columnar crystal is unobserved as defined by Hiramatsu et al. A magnification of about 2,000,000 is necessary to clearly identify the presence or absence of a columnar crystal, and a single visual field is limited to a range of about 50 nm. Accordingly, in order to observe a visual field of 200 nm, the image must be observed about four times by shifting the position. The present invention is a method where when heteroepitaxially growing a crystal, a crystal having intermediate physical properties is interposed between the substrate and the crystal to be grown. If a grain boundary is present in the layer, a defect is inherited therefrom and for this reason, the grain boundary must be reduced as much as possible. The approach using the buffer layer of conventional techniques is a method where as many columnar crystals as possible are caused to exist and absorb a mismatch between the substrate and the crystal to be grown and out of many crystals, only crystals aligned in the crystal direction are laterally grown, thereby growing the desired crystal, and therefore, the properties required of the AlN layer are utterly different from those of the AlN seed layer of the present invention. It is ideal that absolutely no columnar crystal is present, but when a columnar crystal is not observed in a visual field of at least 200 nm, a great improvement is expected in the luminescence properties of LED.

In the case of planar TEM, identification of a columnar crystal is relatively easy. When an electron beam enters perpendicularly to the (0001) plane of a columnar crystal, a difference in the density of a bright field image is produced between the portion where the plane directions are perfectly aligned and the portion where the plane directions are not aligned. Accurate alignment with one columnar crystal makes the grain interior dark and makes the boundary lighter because of slight shifting in the orientation. When a columnar crystal is not observed at least in a 200 nm-square visual field, preferably in a 500 nm-square visual field, this is expressed in the present invention that a grain boundary is unobservable.

The AlN crystal film of the present invention has high crystallinity as described above and at the same time, has high flatness, and the arithmetic mean surface roughness (Ra) (JIS B0601) of the AlN crystal film surface is preferably 2 Å or less, more preferably 1.5 Å or less. The surface roughness measurement includes a method using an atomic force microscope (AFM), and an optically measuring method such as optical surface analyzer (OSA). In the AFM measurement, the value varies depending on the visual field measured. The measured value of a 5 μm² visual field with AFM is used as a basis. Incidentally, in the present invention, as described later, when a region disallowing growth of the seed layer is formed by processing the C-plane sapphire substrate surface to provide a region in a stripe or island/sea fashion having periodicity and thereby form a plane other than C-plane, Ra of the AlN crystal film formed in the region allowing growth of the seed layer may exceed 2 Å.

According to the metal-organic chemical vapor deposition (MOCVD) method, defects such as threading dislocation in the C-axis direction can be reduced by effectively utilizing lateral growth, but when a thin film is formed by sputtering, the film is basically deposited in the growth direction and therefore, the surface texture of the substrate very sensitively affects the film properties compared with the case using a low-temperature buffer layer. Non-uniform growth due to defect or contamination present in the sapphire substrate produces a grain boundary and therefore, in order to form a grain boundary-free thin film, the cleanliness of the substrate surface is preferably kept up with high precision.

For this purpose, a plasma treatment of beating out the contamination on the surface may be performed, but if this treatment is excessively strong, the surface is becomes roughened. On the other hand, when a relatively large number of contaminations are adhering to the surface, if the treatment is too weak, a sufficiently clean surface cannot be obtained. It is preferred for producing a grain boundary-free AlN thin film to consistently maintain the balance therebetween. If the plasma treatment conditions can be varied according to the contamination level, this is preferred but is actually impracticable because quantitative evaluation of the contamination level is extremely difficult. So, specifically, the condition before loading into a sputtering apparatus must be adequately controlled. A certain stock time is inevitably involved from wet cleaning and drying in polish finishing to loading into a sputtering apparatus. The surface is somewhat contaminated during this period and therefore, the contamination is preferably removed, if desired, before the loading into a sputtering apparatus. In the case where the stock time is long, the oxygen concentration of the obtained AlN crystal film may be partially increased and the crystallinity may also be partially impaired. In the case where the stock time is short, the above-described plasma treatment is not necessarily required.

As described above, in conventional techniques, a low-temperature buffer method is used for growing a GaN-based crystal on a sapphire substrate. In this case, the growth of a GaN-based semiconductor on the low-temperature buffer layer exhibits a characteristic behavior such that unevenness is once produced on the surface and then gradually filled in the subsequent lateral growth. The surface reflectance measured in-situ greatly decreases at the uneven portion. When filling of the unevenness is finished, a flat surface reappears and the reflectance is restored (*Japanese Journal of Applied Physics*, Vol. 30, No. 8, August, 1991, pp. 1620-1627).

On the other hand, in the method of the present invention, a GaN crystal is epitaxially grown on a grain boundary-free AlN film and therefore, can grow while allowing the surface to maintain the flatness of the sapphire substrate. Accordingly, when the surface reflectance is measured in-situ, the reflectance is not changed. Also from this, it can be confirmed that the AlN crystal film seed layer (sometimes referred to as a "seed layer" or an "AlN seed layer") of the present invention utterly differs in the growth mechanism from the low-temperature buffer layer.

In the AlN crystal film of the present invention, the oxygen content is preferably 5 atm % or less, more preferably 3 atm % or less, and in view of the effect and cost as a seed layer, preferably 0.1 atm % or more.

According to the knowledge of the present inventors, when oxygen is mixed in the AlN thin film, a grain boundary originated therefrom is readily produced. Therefore, in order to suppress the production of a grain boundary, the amount of oxygen intruded into the thin film must be reduced as much as possible. Also, if a grain boundary is produced, the growth rate differs between the grain boundary and other portions and in turn, the surface is gradually roughened. As a result, the film cannot grow while maintaining the flatness of the sapphire surface and is found to gradually change for the worse.

Oxygen is considered to enter through the following two pathways.

(1) The vacuum degree of base pressure is low. When the vacuum degree of the base pressure is higher than $10^{-4}$ Pa, the remaining gas almost consists of $H_2O$ and $H_2$. $H_2O$ decomposes in plasma and supplies O.

(2) $H_2O$ adheres to the shield surface even when the base pressure is sufficiently lowered and upon generation of plasma and exposure of the shield to the plasma, $H_2O$ is released from the surface into plasma. This occurs when the degassing treatment of shields that are exposed to plasma is insufficient.

In order to prevent mixing of oxygen, it is preferred first to lower the base pressure as much as possible. However, in view of structure, if an O-ring is not used, the apparatus becomes extremely expensive. When an O-ring is used, because of its heat resistance, the chamber wall surface can be heated only to 100° C. Unless the wall surface is heated to 200° C. or more, degassing from the chamber inner wall cannot be completely suppressed, and the limit is about $5\times10^{-6}$ Pa. In the case of sputtering, due to degassing by the cause of (2) above, no effect is obtained even when the base pressure is lowered. Degassing due to (2) above can be confirmed using a quadrupole mass spectrometer (for example, Transpector XPR3 manufactured by Inficon). The detection sensitivity is 10 ppm. In the present invention, it was found that when oxygen is detected at the time of causing discharge, the oxygen content of the AlN seed layer deposited exceeds 5 atm %.

The oxygen in the AlN thin film can be measured by X-ray Photoelectron Spectroscopy (XPS or Electron Spectroscopy for Chemical Analysis: ESCA, for example, "AXIS-NOVA" manufactured by KRATOS).

The resolution in the depth direction is determined by the depth to which a photoelectron can fly off, and therefore, is about 100 Å. The method for compositional analysis in the depth direction includes Auger Electron Spectroscopy (AES) and Secondary Ionization Mass Spectroscopy (SIMS). In the case of an insulator such as AlN on sapphire, the Auger electron spectroscopy cannot be used, because an electron beam is irradiated and charge-up occurs. SIMS has sensitivity high enough to quantitatively determine trace impurities but on the other hand, those contained in an amount of near 1% may contaminate the interior of the chamber and therefore, this method cannot be used. Those below the lower detection limit (about 0.5 atm %) of XPS can be analyzed by SIMS to quantitatively determine the amount mixed.

During film deposition, a shield is generally disposed to prevent film deposition on the chamber wall surface. Generally, the shield is blasted to roughen the surface so as to prevent the deposited film from immediately falling off. The shield is increased in the surface area by the blasting and therefore, the amount of gas adsorbed is large. In order to suppress mixing of oxygen as much as possible, the following attentions are required to the shield. The amount of oxygen generated during discharge comes to differ due to disposing the shield. If the shield is disposed too close to the chamber wall surface, the temperature does not rise to fail in achieving sufficient degassing, and outgassing endlessly continues. Also, the shield disposed too close to the cathode is hit very hardly by the plasma and the contamination attached during blasting is beaten off. The heater used to heat the substrate also heats the shield, but if the temperature excessively rises, the shield may be warped or depending on the material, may melt. In view of impurities from the shield, the shield material is optimally pure Al. The shield is preferably disposed in a cylindrical manner so that the shield can be uniformly heated to 200° C. or more. Also, thermal spraying of Al may be performed in place of blasting to form unevenness and thereby prevent falling off. The material, shape and location of the shield may be examined in this way, whereby oxygen generated during discharge can be decreased, as a result, the amount of oxygen contained in the AlN seed layer can be reduced to 5 atm % or less. Film deposition is performed after performing gas analysis during discharge and confirming that a peak assigned to oxygen is not recognized, whereby the amount of oxygen contained in the AlN seed layer can be controlled to 5 atm % or less.

The Group III nitride semiconductor multilayer structure of the present invention has high crystallinity and preferably, the full width at half maximum of the X-ray diffraction rocking curve of the (0002) plane and the (10-10) plane of the AlN crystal film are 100 arcsec or less and 1.7°, respectively.

In evaluating the AlN seed layer by X-ray diffraction, when selective/lateral direction is combined, the things are slightly different and this is described here. In evaluating the crystallinity, the wavelengths of X-rays entered need to be aligned as much as possible. However, when the wavelengths are aligned, the intensity decreases. In the case of processing the substrate to create a portion allowing growth of the seed layer and a portion disallowing the growth, the seed layer is as very thin as 30 nm and moreover, the area is halved. Therefore, the diffraction intensity of X-ray is weakened and the accuracy deteriorates. Particularly, in the case of entering the ray in parallel to C-plane so as to obtain the rocking curve of the (10-10) plane, when the substrate is processed to create a plane other than C-plane so as to disallow growth of the seed layer or the sapphire substrate surface is partially masked with $SiO_2$, unevenness is present on the surface and causes scattering of the incident X-ray and the amount diffracted from the AlN seed layer becomes very small, as a result, not only the accuracy of the full width at half maximum of the X-ray diffraction rocking curve is impaired but also the half-width is sometimes broadened due to scattering from the plane other than C-plane. For this reason, although the AlN seed layer grown on the C-plane has a grain boundary-free structure similarly to the case of being grown on the entirely C-plane substrate, the full width at half maximum of the X-ray diffraction rocking curve in X-ray diffraction becomes a somewhat bad value due to noise.

The crystallinity is described below. When defects are roughly classified into a one-dimensional defect, a two-dimensional defect and a three-dimensional defect, the one-dimensional defect is typically a pore, the two-dimensional defect is typically a dislocation, and the three-dimensional defect is typically a grain boundary. In order to effectively use the energy gaps for luminescence, to begin with, a single crystal must be grown. A single crystal does not have a grain boundary, but the method for confirming it varies depending on the crystallinity. First, when it is confirmed that the diffraction peak is produced from only one plane in 2θ analysis by X-ray diffraction (XRD) or spots form one kind of a diffraction pattern due to reflection or transmission in electron beam diffraction, this reveals the absence of a definite grain boundary. Next, even when the diffraction peak is produced from one plane, if its width is broad, this reveals that various defects are contained and the plane spacing is not constant. Therefore, the sharpness of the diffraction peak is the next problem. If the width is approximately the same as the width of incident X-ray, whether the crystallinity is good or bad cannot be compared using the width of the diffraction peak. Then, the crystallinity is evaluated by measuring the physical quantities related to the defect density. In the case of a GaN single crystal, the electron density without doping is regarded as corresponding to the N lattice defect density of the GaN and is measured. However, when this value becomes $10^{+16}/cm^2$ or less, the value cannot be an index. Accordingly, a method of enlarging the defect by dry etching with $Cl_2$ gas and observing it through an optical microscope is employed (*Appl. Phys. Lett.*, Vol. 72 (1998), 211). Furthermore, cathode luminescence (CL) enables the defect portion to be directly observed using a scanning electron microscope (SEM), and defect density measurement by CL becomes popular (*Jpn. J. Appl. Phys.*, Vol. 37 (1998), L398). As a method for more easily measuring the defect density, it is proposed that the defect density can be estimated by observing the full width at half maximum of the X-ray diffraction rocking curve in XRD (*J. Appl. Phys.*, Vol. 63 (1988), 1486). This method is simple, non-destructive and capable of total measurement and therefore, is optimal as the method for quantitatively determining the crystallinity. Therefore, in the present invention, this method is employed as the method for quantitatively determining and expressing the crystallinity. The p-GaN layer as the final layer of the LED structure is analyzed by X-ray diffraction, and the full width at half maximum of the X-ray diffraction rocking curve (FWHM) in X-ray diffraction of the (0002) plane and the (10-10) plane of the p-GaN crystal are used.

In the case of using a conventional AlN or GaN buffer layer, as for the crystallinity of the buffer layer itself, FWHM of the (0002) plane is on the order of several thousands to several tens of thousands of arcsec, and that of (10-10) cannot be measured. It is believed that even when the crystallinity is enhanced with the subsequent stacking thereon, in the case of the p-GaN layer, 100 arcsec on the (0002) plane and 300 arcsec on the (10-10) plane are the limit. The crystallinity of 300 arcsec on the (10-10) plane corresponds to a dislocation density of $1 \times 10^9/cm^3$ as measured by the CL method.

In the present invention, the full width at half maximum of the X-ray diffraction rocking curve is measured using CuKα ray as the X-ray source, using an incident beam with a divergence angle of 0.01°, and using a "PANalytical X'pert ProMRD" apparatus manufactured by Spectris Co., Ltd.

Also, as for the measurement of the rocking curve of the (0002) plane, after finding the peak corresponding to the (0002) plane, 2θ and ω are optimized and then the rocking curve is measured in the direction having a maximum peak intensity. The rocking curve is measured in this way and an error attributable to the fact that the manner of mounting the substrate in the apparatus and the orientation direction with respect to the substrate differ depending on the sample to be measured, is thereby corrected, so that the full width at half maximum of the X-ray diffraction rocking curve can be compared among samples to be measured.

The rocking curve of the (10-10) plane can be measured using the X-ray transmitted through the plane under the conditions allowing total reflection of the X-ray. Specifically, when an X-ray source capable of diffusing in the direction perpendicular to the measurement sample placed horizontally enters from the horizontal direction, the X-ray partially undergoes total reflection and this is utilized. Also, φ scan is performed by fixing the detector at the 2θ position corresponding to the (10-10) plane. A peak of hexagonal symmetry is measured and after fixing the optical system to the peak position showing the maximum intensity, the rocking curve is measured by optimizing 2θ and ω.

In the case where the X-ray can be hardly caused to enter under the conditions allowing total reflection, the rocking curve may be determined by estimating the (10-10) diffraction data from the (10-12) diffraction results.

Generally, in the case of a Group III nitride compound semiconductor, the XRC spectrum half-width of the (0002) plane is indicative of the crystal tilt (slight inclination of the grown crystal plane direction with respect to the growth direction), and the XRC spectrum half-width on the (10-10) plane is indicative of the twist (slight inclination of the crystal direction within the growth plane) (*Jpn. J. Appl. Phys.*, Vol. 38 (1999), L611).

(Sapphire Substrate)

In the present invention, the sapphire substrate (11) surface (11a) is preferably well cleaned. In the cleaning, it is preferred to maximally remove particles such as residual abrasive and sapphire debris; a surface scratch created during handling and an extremely gentle unevenness or a minute compositional variation, called "subsurface scratch"; an organic material thin film resulting from attachment of an organic material floating in the air onto the surface; and particles generated by the contact with a jig in the process or dusts present in the environment.

Furthermore, the flatness of the substrate surface preferably satisfies the following conditions. As the single crystal orientation, the C-plane (0001) is used.

A: Ra is 3 Å or less, preferably 2 Å or less, more preferably 1 Å or less.

B: The off-angle is appropriate, preferably from 0.1 to 0.7°, more preferably from 0.3 to 0.6°.

C: The step of each plane is distinct to a level high enough to be observable through an atomic force microscope (AFM) or the like. A higher areal density is better.

D: Protrusions other than the step produced by creating an off-angle are preferably as few as possible.

Incidentally, as for the crystallinity of the sapphire single crystal, the number of defects is of course preferably smaller, but since this single crystal is a substrate for heteroepitaxial growth, it is important to ensure the above-described surface texture, and a slight difference in the crystallinity of the substrate does not significantly affect the characteristics of the GaN-based semiconductor after epitaxial growth. Accordingly, cost is the top priority for the method of growing a sapphire single crystal.

The present invention exerts the effects particularly when the diameter of the sapphire substrate is 100 mm or more.

The sapphire substrate is disposed in a film deposition apparatus capable of generating plasma in a vacuum, and an AlN crystal seed layer is formed. Even when the sapphire substrate surface is thoroughly cleaned as described above, a certain period of time is generally spent from the completion of cleaning and drying of the substrate to the loading into the film deposition apparatus. Even when the substrate is vacuum packed in a clean room and taken out in a clean room, the surface generally undergoes a change over a wide range depending on the conditions. For this reason, the sapphire surface is preferably made up using plasma immediately before disposing it in a vacuum apparatus and depositing a film.

As for the conditions in the surface plasma treatment, the important parameters are the voltage applying method, the type of gas, the gas pressure, the applied power and the temperature.

(Voltage Applying Method)

The method for producing plasma in the chamber is roughly classified into 4 types according to whether the applied voltage is DC or RF or whether the objective to which the voltage is applied is the target or the substrate when the chamber is earthed. For two reasons that the sapphire substrate is an insulating substrate and that an atom flying off from the target may attach to the substrate surface to lose the purpose, an RF voltage is preferably applied to the substrate side for making up the sapphire substrate surface immediately before film deposition.

(Type of Gas)

The type of gas used to generate plasma is not particularly limited. However, use of a highly reactive gas is preferably avoided, because the main purpose is to remove an organic material on the surface and if an atom on the sapphire substrate surface is beaten out, the step of the surface may be disordered. Also, even with an inert gas, a heavy atom surpasses in the destructive force and this is not preferred. He and $H_2$ may be considered but these gases have unstable plasma discharge and if Ar is mixed until the discharge is stabilized, the destructive force of Ar becomes a problem. Accordingly, $O_2$ or $N_2$ is preferred. However, when $O_2$ remains even in a trace amount in the chamber, this gas may inhibit crystal growth in the subsequent sputtering of AlN. For this reason, a treatment using $N_2$ plasma is most preferred. However, a rare gas such as Ar may be mixed for the purpose of keeping the plasma stable.

(Applied Power and Gas Pressure)

The power charged is preferably as low as possible and may be sufficient if it is in a minimum level where the plasma can be kept stable. For the sizes of chamber and cathode used in the present invention, the most appropriate power charged is approximately from 10 to 100 W. As for the gas pressure, if it is high, particles collide with each other to lose the kinetic energy, whereas if the gas pressure is low, particles having high kinetic energy hit the substrate surface. Therefore, a high pressure in the range allowing the plasma to be kept stable is preferred. If the gas pressure is forcedly increased, a high power is required to keep the plasma stable, and if the power exceeds 100 W, more defects than the range where the surface can be made up, may be introduced. For this reason, the most appropriate gas pressure is from 0.8 to 1.5 Pa.

(Temperature)

The temperature is not a very important parameter in view of making up the sapphire substrate surface. The purpose can be achieved at any temperature from room temperature to 1,000° C., but the temperature is preferably from 300 to 950° C. However, in the light of the following film deposition, the same temperature as that in the subsequent film deposition is preferred. If the temperature exceeds 800° C., the damage may be excessively large. The surface plasma treatment may also be performed in a separate chamber, and this is advantageous in that the throughput can be increased and the temperature can be separately set, but is disadvantageous in that a certain time is required from the surface plasma treatment to the subsequent film deposition and surface contamination may occur.

Subsequently, the AlN seed layer (12) is deposited. A single crystal is a crystal free from a crystal grain boundary and indicates a crystal having the same crystal orientation in all portions. However, unless it is a perfect crystal, some defects are present and the crystal orientation becomes slightly changed due to location of the defect. Accordingly, it is actually difficult to know the degree to which the defects are introduced, in which a polycrystal is formed. The following conditions must be satisfied so that no grain boundary can be recognized in at least a 200 nm visual field by the TEM cross-sectional observation of the AlN seed layer on the sapphire substrate.

In the case of a C-plane thin film, first, the width of the diffraction peak of the (0002) plane should be considered regarding crystallinity. A sufficiently sharp diffraction peak indicates that blankless planes are aligned with a constant plane spacing. The rocking curve sharpness (FWMH) is the measure to confirm whether the planes are oriented in the same direction in all portions. If the orientation is not adequate, the growth may proceed in arbitrary directions and a smooth plane cannot be ensured. Accordingly, as for the crystallinity as a seed layer, both the (0002) plane and the (10-10) plane must be taken into consideration. The FWHM of the (0002) plane is indicative of the distribution of angles with respect to the substrate surface and therefore, must be extremely sharp as a prerequisite. Next, the full width at half maximum of the X-ray diffraction rocking curve of the (10-10) plane is indicative of how many portions are partially rotated as viewed from the direction perpendicular to the substrate surface. When the half-width above becomes large, defects will penetrate in the C-axis direction, and therefore this is an important parameter for minimizing a leak current. However, the seed layer may be sufficient if it has no discontinuous boundary. In the AlN seed layer of the present invention, it can be confirmed that when a sample having a (10-10) plane rocking curve half-width of 1.7° or less is observed by planer TEM in a 200 nm×200 nm observation field, a discontinuous grain boundary is not present. The full width at half maximum of the X-ray diffraction rocking curve (FWHM) in X-ray diffraction of the (0002) plane and the (10-10) plane of AlN are preferably 100 arcsec or less and 1.7° or less, respectively. Within these ranges, a GaN-based semiconductor can be epitaxially grown thereon, and the crystallinity of a p-GaN contact layer as the final layer formed by growing an LED structure can be achieved in a level that the XRC FWHM is preferably 60 arcsec and 250 arcsec for the (0002) plane and the (10-10) plane, respectively.

In the method for producing a Group III nitride semiconductor multilayer structure of the present invention, in order to obtain the above-described Group III nitride semiconductor multilayer structure, the oxygen content in the obtained AlN crystal film is preferably controlled to be 5 atm % or less. The method for the control may be the method described above.

Other important parameters in the production method of an AlN seed layer of the present invention are the type of target, the method for applying voltage/magnetic field, the type of gas, the distance between the target and the substrate, the form of plasma, the volume for confining plasma, the gas pressure, the applied power and the film deposition temperature. These are described below in sequence.

(Type of Target and Method for Applying Voltage/Magnetic Field)

The method for producing plasma in the chamber is roughly classified into 4 types according to whether the applied voltage is DC or RF or whether the objective to which the voltage is applied is the target or the substrate when the chamber is earthed. As for the target to deposit an AlN film, there are a case where high-purity AlN is used as the target and a case where high-purity Al as the target and a gas containing $N_2$ are used and $N_2$ is decomposed by plasma to cause a reaction of Al and N. Sintering of high-purity AlN powder requires addition of a sintering aid such as $CeO_2$, and this disadvantageously makes it difficult to obtain a high-purity dense AlN target. In contrast, high-purity Al is commercially available up to 6N. A purity of at least 5N or more is preferred to achieve the object of the present invention. In the case of bringing about discharge by DC, the target must be an electrically conductive material. Accordingly, when high-purity AlN is selected for the target, the voltage applied must be necessarily RF. When the target is high-purity Al, both DC and RF may be used. However, AlN may be formed on the Al surface to create insulation and if the case is so, electrical charges may be accumulated to cause a lightning strike phenomenon. For this reason, in the case of DC, pulsed application may be used to prevent formation of an AlN film. The advantages and disadvantages of DC and RF are as follows.

Advantages of DC:

The power source is inexpensive. The control is easy. The cathode and the anode are distinct for defining the portion which is hit by plasma and the portion on which a film is deposited. The design for reducing impurities is facilitated.

Disadvantages of DC:

The range allowing the discharge to be stabilized is narrow. The kinetic energy range is narrow.

Advantages of RF:

The range allowing the discharge to be stabilized is broad. The kinetic energy range is broad.

Disadvantages of RF:

The power source is expensive. A matching box is required, and time until discharge formation is prolonged. The cathode and the anode are indistinct, and particles are beaten out by plasma from any portion of the shield. The design for reducing impurities is difficult.

In both cases of DC and RF, a magnetic field must be created to stabilize the plasma. The device for creating a magnetic field includes two types, i.e., a permanent magnet and an electromagnet, and in many cases, the magnet is moved to make the magnetic field uniform. In the case of a circular target, a permanent magnet is rotated in general, and in the case of a square target, a permanent magnet is reciprocated. In the case where a permanent magnet cannot be properly disposed, a system called ICP electrode with a coil being placed outside may be used. The plasma density depends mainly on the strength of the magnetic field and therefore, the strength of the magnetic field needs to be uniform so as to obtain a uniform film thickness. Combination of various magnetic field generating methods is often employed.

Considering all of these matters together, in the case of depositing the AlN seed layer, RF discharge using a high-purity Al target is most suitable.

(Type of Gas)

As for the type of gas used to generate plasma, when the target is AlN, a rare gas having an effective mass, such as Ar, Xe and Kr (preferably Ar), may be used alone (hereinafter, the rare gas is Ar), but in the case of an Al target, Ar and $N_2$ are required. If only $N_2$ is used, AlN is produced before the Al atom is beaten off and the film deposition scarcely proceeds. If only Ar is used, a metal Al thin film is deposited. Although AlN is formed with an increase in the amount of $N_2$, if the $N_2$ gas partial pressure is low, insufficient $N_2$ for AlN causes coloration of the film. For exactly nitriding atoms flied off as Al, the amount of the activated $N_2$ must meet the number of Al atoms beaten off. If its amount is excessively large, a large number of defects are introduced into the AlN crystal film, and a colored film results. For this reason, a gas prepared by mixing Ar and $N_2$ in an appropriate ratio is preferably used. The appropriate ratio varies depending on the gas pressure and applied power. The rate at which Al is beaten off depends on the applied power but does not depend on the gas pressure. On the other hand, the activation rate of $N_2$ is higher as the gas pressure is lower. Accordingly, in the case where the gas pressure is low, the ratio of Ar is preferably lowered, and also when the applied power is high, it is preferred to lower the ratio of Ar. As for the nitrogen raw material used in the present invention, a generally known compound such as $NH_3$ may be used. In the case of using a nitrogen gas as the nitrogen raw material, the apparatus may be simple, but a high reaction rate can be hardly obtained because $N_2$ is very stable and difficult to activate. In the present invention, activation of $N_2$ in the vicinity of the substrate surface is utilized by placing the sapphire substrate in plasma, so that $N_2$ can also give a film deposition rate high enough to be utilized, though the rate is lower than that of ammonia.

(Distance Between Target and Sapphire Substrate)

In the case of a sapphire substrate having a diameter of 100 mm, the target size needs to be about 200 mm in terms of diameter so as to uniformly deposit a film over the entire surface. A magnetic field is generally created to stabilize the plasma, and the magnet is placed behind the target. Thanks to this arrangement, the magnetic field is concentrated on the target surface and in turn, the plasma density also becomes high on the target surface. In the present invention, plasma particles having high energy are intended to react with each other on the substrate surface and for this purpose, the substrate is preferably disposed in a portion having as high a plasma density as possible. If the distance between the target and the substrate is too large, the substrate cannot be placed in a portion having a high plasma density and this is not preferred. For example, the distance between the target and the sapphire substrate is suitably on the order of 40 to 80 mm for a target of 200 mm in diameter. This distance is preferred, because in the present invention, the sapphire substrate is placed in plasma and an AlN crystal film is thereby deposited by a sputtering method.

(Form of Plasma and Volume for Confining Plasma)

If the plasma reaches the chamber wall surface, the wall surface is contaminated and the contamination is difficult to remove. Therefore, a shield is generally used to confine the plasma. The shield not only is used to prevent the chamber wall surface from contamination but also functions as an electrode when the chamber is earthed, and from this aspect, the form of the plasma is specified. The evacuation efficiency must be improved to increase the degree of vacuum and for this purpose, the chamber is preferably as small as possible. However, if the plasma is confined in a too small place, the shield is beaten by the plasma and the components of the shield enter the film deposited. In particular, a water molecule is unavoidably adhering to the shield surface and when the molecule is released upon beating by the plasma, OH or O intrudes into the film. For this reason, the shield is preferably not in a dimension to put it in proximity with the target but is disposed at a certain distance therefrom, and the dimension is preferably at least about 300 mm in terms of diameter.

(Gas Pressure/Applied Power)

It is considered that the base pressure fundamentally determines the film quality. In the present invention, a high vacuum of $1\times10^{-5}$ Pa or less, preferably $5\times10^{-6}$ Pa or less, is suited. If the degree of vacuum is less than the range above, impurities such as oxygen entering the film from the atmosphere may enter the deposited AlN film, and defects may be introduced into the crystal. Also, even when the base pressure is sufficiently lowered, impurities such as water on the shield surface may be beaten off upon generation of plasma, and the film quality may be thereby deteriorated.

If the gas pressure is high, particles collide with each other in the plasma and lose their kinetic energy. In order to deposit the AlN seed layer of the present invention, Al and N having high kinetic energy need to react on the substrate surface and therefore, an excessively high gas pressure is not preferred. On the other hand, if the gas pressure is too low, the amount of $N_2$ plasma particles colliding and reacting with the Al target is disadvantageously increased. For this reason, the gas pressure is suitably from 0.3 to 0.8 Pa which is a general sputtering gas pressure. The applied power is proportional to the film deposition rate and if the applied power is too low, a sufficiently high rate cannot be obtained. Although residual gas components such as $O_2$ and $H_2O$ present in the atmosphere unavoidably intrude, the intrusion amount is thought to be constant per time. Accordingly, if the film deposition rate is low, the intrusion amount is relatively increased, and the purity in the film is disadvantageously lowered. A film deposition rate as high as possible is necessary and therefore, the applied power is preferably higher. However, if excessively large power is applied, impurities are generated from the shield, because the shield is directly exposed to plasma. For this reason, the applied power is preferably from 500 to 2,500 W for a target of about 200 mm in diameter. The appropriate gas pressure varies depending on the applied power. When the applied power is large, a relatively high gas pressure within the suitable range is preferred, and when the applied power is small, a relatively low gas pressure within the suitable range is preferred.

(Film Deposition Temperature)

The substrate temperature during film deposition is preferably from 300 to 800° C. If the temperature is less than 300° C., the distance at which an atom reaches the substrate moves for forming a single crystal becomes insufficient, failing in covering the entire surface, and production of a pit is liable to start. From the standpoint of producing the seed layer of the present invention on the substrate surface, it is advantageous to raise the temperature to a temperature at which AlN starts decomposing, and since the temperature is about 1,200° C., the upper limit is a temperature higher than that. However, the fixed jig and shield in the periphery of the substrate also undergo a rise in temperature in parallel, and degassing therefrom and in turn, mixing of impurities are increased. Therefore, setting to an excessively high temperature does not necessarily yield good results. For this reason, the temperature is preferably not raised above 800° C. in the actual process. Nevertheless, if a structure capable of maintaining a high degree of vacuum even when set to a high temperature can be achieved, film deposition at a higher temperature is more advantageous for increasing the crystallinity.

The thickness of the AlN crystal film is from 10 to 50 nm, preferably from 25 to 35 nm. If the thickness is less than 10 nm, it is difficult for the GaN crystal stacked thereon to sufficiently increase the (0001) plane crystallinity. On the other hand, if the thickness exceeds 50 nm, GaN stacked thereon starts deteriorating in the (10-10) plane crystallinity.

In the present invention, subsequently, a Group III nitride semiconductor layer (20) consisting of an n-type semiconductor layer (14), a light-emitting layer (15) and a p-type semiconductor layer (16) is stacked on the seed layer (12) of AlN crystal film, whereby a Group III nitride semiconductor multilayer structure (10) is obtained. When a seed layer (12) is formed on the sapphire substrate (11), a GaN-based single crystal can be relatively easily grown thereon, because this is close to homoepitaxial growth. Growth of a GaN-based single crystal structure having a low defect density is realized by the widely employed MOCVD method. The MOCVD method may be a general method. The outline thereof is as follows.

There are used hydrogen ($H_2$) or nitrogen ($N_2$) as the carrier gas; trimethylgallium (TMG) or triethylgallium (TEG) as the Ga source that is a Group III raw material; trimethylaluminum (TMA) or triethylaluminum (TEA) as the Al source; trimethylindium (TMI) or triethylindium (TEI) as the In source; and ammonia as the N source that is a Group V raw material.

For the dopant element n-type impurity, monosilane ($SiH_4$) or disilane ($Si_2H_6$) can be utilized as the Si raw material. For the dopant element p-type impurity, biscyclopentadienyl magnesium ($Cp_2Mg$) or bisethylcyclopentadienyl magnesium ($EtCp_2Mg$) can be used as the Mg raw material.

As for the carrier gas flowed here, a general carrier gas can be used, and hydrogen or nitrogen widely used in the chemical vapor deposition method such as MOCVD may be used.

The substrate temperature needs to be lower than the temperature at which GaN starts decomposing. GaN starts slightly decomposing at above 950° C. and unfailingly decomposes at 1,000° C. or more. The decomposition temperature also depends on the crystallinity of GaN and since the decomposition is considered to start from a portion having a defect, a crystal having a smaller number of defects decomposes at a higher temperature. Accordingly, when the crystal is grown at a temperature allowing the decomposition to slightly start, the portion having a defect decomposes and only a defect-free portion remains. For this reason, the temperature setting is very important for the growth with as little defects as possible. Thanks to the mechanism above, the defects can be reduced along the growth by depositing the film at an appropriate temperature.

The GaN-based single crystal near the AlN crystal film seed layer/GaN-based single crystal interface contains a relatively large number of defects. When this crystal is grown to a fixed thickness, the defects are gradually removed, and a single crystal having a very low defect density can be obtained. The thickness necessary to remove the defects must be at least 2 μm, and for obtaining sufficient crystallinity, the thickness is usually from 4 to 8 μm. Even if the thickness exceeds this range, the effect is small and warpage is increased. In an extreme case, cracks start developing in the crystal. If the warpage is excessively large, photolithography in the device fabrication step of attaching an electrode becomes difficult.

The crystallinity of the GaN-based single crystal film grown on the AlN crystal film seed layer of the present invention is very excellent. Here, the index for quantitatively determining the crystallinity is described again. The full width at half maximum of the X-ray diffraction rocking curve of the (0002) plane and the (10-10) plane of the GaN crystal (FWHM: Full Width at Half-Maximum for (0002) and (10-10) diffraction) are used. The full width at half maximum of the X-ray diffraction rocking curve (FWHM) of the (0002) plane is 100 arcsec or less, preferably 60 arcsec or less, and the full width at half maximum of the X-ray diffraction rocking curve of the (10-10) plane is 300 arcsec or less, preferably 250 arcsec or less. The FWHM of the (10-10) plane is believed to correlate with the amount of threading dislocations, and the values above mean that the amount of threading dislocations is extremely low. The luminous efficiency correlates with the amount of threading dislocations. Because, the luminous efficiency is the extent to which the current flowing between p-GaN and n-GaN is converted into light, and when a current flows out through a threading dislocation, the luminous efficiency decreases in proportion.

The growth of the GaN-based semiconductor layer is basically the same as the growth on a low-temperature buffer using AlN or GaN. However, in view of an approach selecting a temperature in the vicinity of the temperature allowing the decomposition to start, as described above, the growth temperature can be made higher as the defect density is lower. The present invention is characterized in that due to growth from the AlN crystal film seed layer, growth in a portion having a relatively low defect density can be achieved.

The relationship with the crystallinity of the AlN crystal film seed layer is described again below. In the case of using a conventional AlN or GaN buffer layer, the crystallinity of the buffer layer is, in terms of FWHM, on the order of several thousands to several tens of thousands of arcsec for the (0002) plane, and FWHM cannot be measured on the (10-10) plane. On the other hand, as for the crystallinity of the AlN crystal film seed layer, the full width at half maximum of the X-ray diffraction rocking curve (FWHM) in X-ray diffraction of the (0002) plane and the (10-10) plane are 100 arcsec or less and 1.7° or less, respectively. On the (0002) plane, the GaN crystal may inherit the crystal. As for the (10-10) plane, the defect decreases during growth of GaN. Although the mechanism of decreasing the defect during growth in MOCVD is the same, the density of defects remaining at the start is completely different and therefore, once grown into a polycrystal, it is very difficult to reduce the FWHM of the (10-10) plane to 300 arcsec or less whatever appropriate conditions are employed to stack the film thickly.

In the present invention, a Group III nitride semiconductor layer (20) consisting of an n-type semiconductor layer (14), a light-emitting layer (15) and a p-type semiconductor layer (16) is stacked on the seed layer (12) of AlN crystal film, whereby a Group III nitride semiconductor multilayer structure (10) is obtained. For example, a GaN-based semiconductor layer (20) consisting of an n-type contact layer (14b), an n-type clad layer (14c), a light-emitting layer (15) composed of a barrier layer (15a) and a well layer (15b), a p-type clad layer (16a) and a p-type contact layer (16b) is deposited on the seed layer (12). A preferred embodiment is described below, but the present invention is not limited thereto, and the film deposition method may also be a general MOCVD method.

(n-Type Semiconductor Layer)

In the n-type semiconductor layer (14) containing the n-type contact layer (14b) and the n-type clad layer (14c), an underlying layer (14a) may be provided under the n-type contact layer (14b). The material used for the underlying layer (14a) is a GaN-based compound semiconductor and in particular, AlGaN or GaN may be preferably used. The film thickness of the underlying layer is preferably 0.1 µm or more, more preferably 0.5 µm or more, and most preferably 1 µm or more.

The n-type contact layer (14b) is preferably doped with an n-type impurity such as Si and Ge, and the GaN-based semiconductors constituting the underlying layer and the n-type contact layer preferably have the same composition. The total film thickness of these layers is not particularly limited but is preferably from 1 to 20 µm.

The n-type clad layer (14c) is provided between the n-type contact layer (14b) and the light-emitting layer (15). The film thickness thereof is not particularly limited but is preferably from 5 to 500 nm.

(P-Type Semiconductor Layer)

The p-type clad layer (16a) and the p-type contact layer (16b) constitute a p-type semiconductor layer (16). The p-type clad layer (16a) is not particularly limited as long as it has a composition providing a band gap energy larger than the band gap energy of the light-emitting layer (15) and can confine a carrier in the light-emitting layer (15). For example, AlGaN is suitably used. The film thickness of the p-type clad layer (16a) is not particularly limited but is preferably from 1 to 400 nm.

As to the p-type contact layer (16b), for example, GaN or AlGaN is suitably used, and the film thickness thereof is preferably from 50 to 300 nm, more preferably from 100 to 200 nm. The p-type impurity is not particularly limited, but preferred impurities include Mg.

(Light-Emitting Layer)

The light-emitting layer (15) is also not particularly limited but preferably has a multiquantum well structure where an n-type GaN layer working out to the barrier layer (15a) and a GaInN layer working out to the well layer (15b) are alternately stacked.

TMI is preferably supplied for growth of the GaInN layer, and In is intermittently supplied while controlling the growth time. The carrier gas is suitably $N_2$. As for the film thicknesses of the barrier layer (n-type GaN layer) and well layer (GaInN layer), conditions giving a highest luminous output are selected. After determining the optimum film thickness, the supplied amount and growth time of the Group III raw material may be appropriately selected. The growth temperature is preferably between 700° C. and 1,000° C. in terms of the susceptor temperature. However, in the growth of the well layer, Indium is poorly incorporated into the grown film at a high temperature, and an In solid solution in an amount necessary to achieve luminescence at a predetermined wavelength cannot be obtained. Therefore, a not too high temperature is selected for the growth temperature. Because, the crystallinity of the barrier layer is easily maintained as the temperature is higher, but if the temperature is too high, GaInN in the well layer decomposes. The light-emitting layer (15) is preferably completed by finally growing the barrier layer (15a) (final barrier layer).

The p-type contact layer (16b) is preferably grown, for example, as follows. TMG, TMA and the dopant $Cp_2Mg$ are fed onto the p-type clad layer (16a) together with a carrier gas (hydrogen, nitrogen, or a mixed gas thereof) and an $NH_3$ gas. The growth temperature here is preferably from 980 to 1,100° C. in terms of the susceptor temperature. This is from 830 to 970° C. in terms of the wafer temperature. If the temperature is less than this range, an epitaxial layer having low crystallinity is formed and the hole density of p-GaN may not increase. On the other hand, if the temperature is high, GaInN in the well layer out of the light-emitting layer located in the lower part may decompose to cause precipitation of In.

The growth pressure is not particularly limited but is preferably 50 kPa (500 mbar) or less. Because, when the growth condition is 50 kPa (500 mbar) or less, Mg fed as the dopant can provide a uniform Mg concentration distribution in the two-dimensional direction (in-plane direction of the growth substrate) in the p-type contact layer.

Incidentally, the growth rate is determined by measuring the film thickness of the p-type contact layer by TEM observation or spectroscopic ellipsometry of the wafer cross-section and dividing it by the growth time. Also, the Mg concentration in the p-type contact layer can be determined using a general mass spectrometer (SIMS).

(Fabrication of Transparent Electrode/Cathode Bonding Pad and Anode Bonding Pad)

On the p-type contact layer (16b) of the thus-obtained multilayer semiconductor layer (20), a translucent positive electrode (17) is formed using photolithography. As described later, a positive electrode bonding pad (18) is formed on the translucent positive electrode (17).

Sputtering for film-depositing the transparent electrode may be performed using a conventionally known sputtering apparatus by appropriately selecting conventionally known conditions. The substrate having stacked thereon the gallium nitride-based compound semiconductor layer is housed in a chamber. The inside of the chamber is evacuated until the degree of vacuum reaches $10^{-4}$ to $10^{-7}$ Pa. The chamber is adjusted to 0.1 to 10 Pa by introducing an Ar gas thereinto and then discharge is performed. The chamber is preferably set to a range of 0.2 to 5 Pa. The electric power supplied is preferably from 0.2 to 2.0 kW. At this time, the thickness of the layer formed can be adjusted by controlling the discharge time and the supplied power.

Subsequently, an exposure region (14d) on the n-type contact layer (14b) is exposed by photolithography and dry etching. After depositing a protective film over the entire surface, a pad deposition portion is removed by photolithography and the positive electrode bonding pad (18) and a negative electrode bonding pad (19) are simultaneously formed on the translucent positive electrode (17) and the n-type contact layer (14b) by vacuum vapor deposition. Alternatively, the positive electrode bonding pad (18) and the negative electrode bonding pad (19) each may be produced without using the protective film above.

Figure 2:
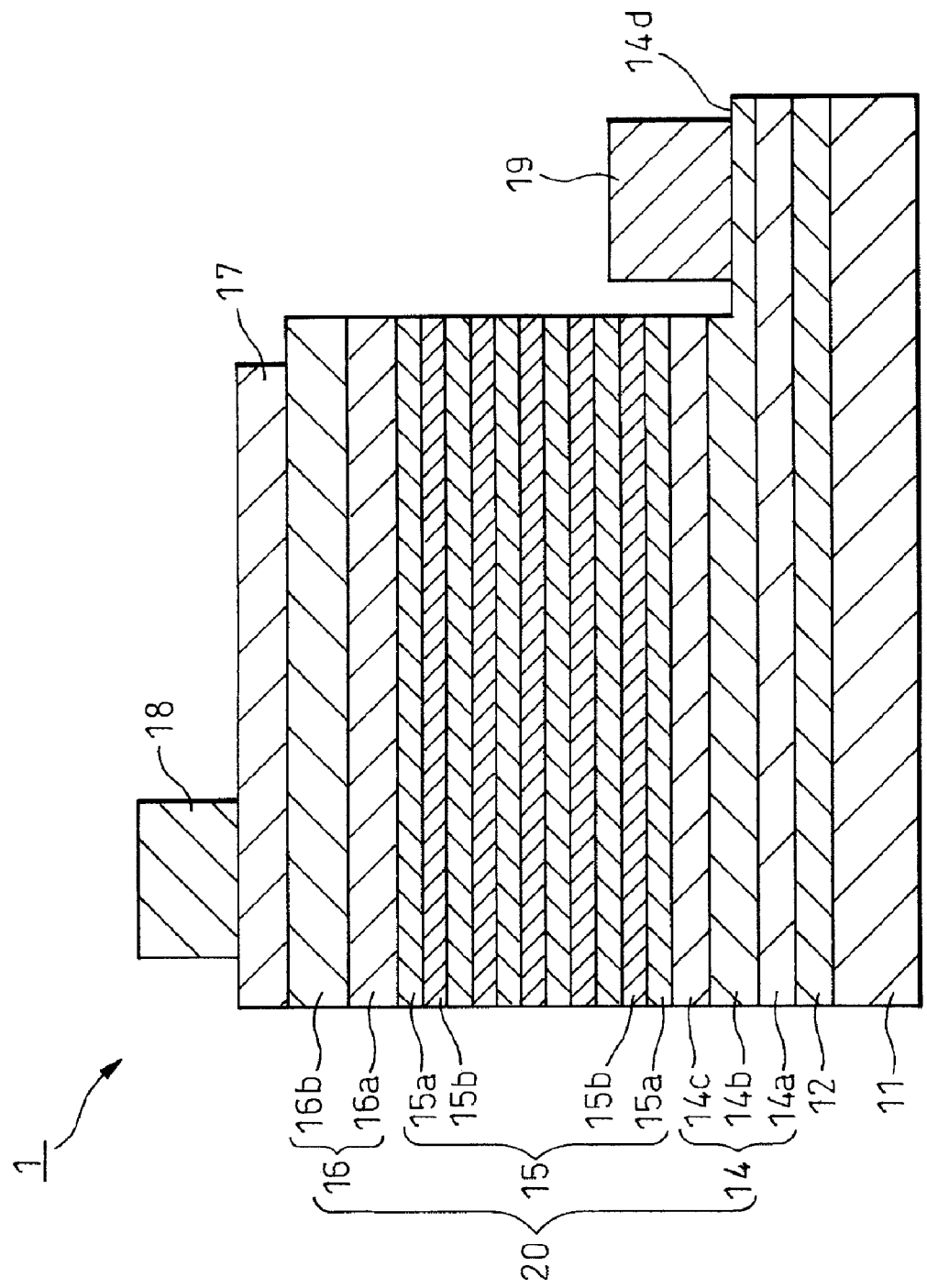
FIG. 2 is a cross-sectional outline view for schematically explaining an example of the light-emitting device using the Group III nitride semiconductor multilayer structure of the present invention.

The semiconductor wafer after production of the electrodes is divided into chips by a conventional method to obtain a light-emitting device 1 shown in FIG. 2 (a case where the protective film above is not used).

Incidentally, the production method of the light-emitting device of the present invention is not limited to this example, and film deposition of the GaN-based semiconductor layer may be performed by combining any method capable of growing a semiconductor layer, such as sputtering method, MOCVD (metal-organic chemical vapor deposition) method, HVPE (halide vapor phase epitaxy) method and MBE (molecular beam epitaxy).

The Group III nitride semiconductor multilayer structure of the present invention is a Group III nitride semiconductor multilayer structure where an AlN crystal film free from a crystal grain boundary observed in the observation field of 200 nm of the longitudinal cross-sectional TEM (transmission electron microscope) photograph is formed as a seed layer on a C-plane sapphire substrate surface and an underlying layer, an n-type semiconductor layer, a light-emitting layer and a p-type semiconductor layer, each composed of a Group III nitride semiconductor, are further stacked, and regions in which the seed layer is present and is absent are formed on the C-plane sapphire substrate surface and/or regions capable of epitaxial growth and incapable of epitaxial growth are formed in the underlying layer. The underlying layer includes a GaN or AlGaN crystal and is preferably GaN.

Such a Group III nitride semiconductor multilayer structure is obtained by producing a Group III nitride semiconductor multilayer structure where an AlN crystal film free from a crystal grain boundary observed in the observation field of 200 nm of the longitudinal cross-sectional TEM (transmission electron microscope) photograph is formed as a seed layer on a C-plane sapphire substrate surface and an underlying layer, an n-type semiconductor layer, a light-emitting layer and a p-type semiconductor layer, each composed of a Group III nitride semiconductor, are further stacked, wherein (A) regions in which the seed layer is present and is absent are formed on the C-plane sapphire substrate surface and/or (B) regions capable of epitaxial growth and incapable of epitaxial growth are formed in the underlying layer.

The seed layer-free region on the C-plane sapphire substrate surface is preferably formed in a stripe or island/sea fashion having periodicity.

The seed layer-free region on the C-plane sapphire substrate surface is obtained by growing an AlN crystal film as a seed layer on the C-plane sapphire substrate layer and then physically removing a part of the AlN crystal film. More specifically, the method for forming regions in which the seed layer is present and is absent includes a method of depositing an AlN crystal film as an AlN seed layer throughout the C-plane sapphire substrate surface, then forming a pattern with a resist by photolithography, and removing the AlN seed layer by etching.

FIGS. 5(a) to (d) schematically show a case where an AlN crystal film is grown as a seed layer on a C-plane sapphire substrate surface and a part of the AlN crystal film seed layer is shaved off. In FIG. 5, an AlN seed layer (12) is deposited on the C-plane (11') surface of a sapphire substrate (11) (a). A resist solution dissolved in an organic solvent is coated on the AlN seed layer (12) to form a resist layer (21) having a predetermined thickness, and a UV exposure treatment using a photomask is performed to print a resist pattern on the AlN seed layer (b). Subsequently, the exposed portion (21-1) (i.e., the non-pattern portion) is dissolved by a development treatment to form a pattern. The portion not protected with the resist layer is subjected to an etching treatment and thereafter, the resist layer no longer required is peeled off, whereby a part of the AlN seed layer (12) is shaved off (c to d).

Such a region where a seed layer is not present on the C-sapphire substrate region is obtained also by forming regions allowing and disallowing growth of the seed layer on the C-plane of the sapphire substrate surface and growing an AlN crystal film only in the region allowing growth of the seed layer. The region disallowing growth of the seed layer is formed using either one of the following methods (α) and (β):

(α) the C-plane sapphire substrate surface is processed to provide a region in a stripe or island/sea fashion having periodicity and thereby form a plane other than C-plane, and (β) a region in a stripe or island/sea fashion having periodicity is covered with amorphous $SiO_2$, amorphous silicon nitride or a high melting-point metal.

The stripe is not particularly limited in its width and interval but preferably has a width of 0.8 to 5 µm and an interval of 3 to 10 more preferably a width of 2 to 4 µm and an interval of approximately from 5 to 8 µm, and the height or depth is usually selected from the range up to about 2 µm. On the other hand, the island is also not particularly limited in its size, shape and interval but preferably has a diameter of 0.8 to 3 µm and a center-to-center distance of 2 to 6 µm, more preferably a diameter of 1 to 5 µm and a center-to-center distance of 2 to 6 µm, and the height or depth is usually selected from the range up approximately to the radius. The shape is preferably circular or polygonal but is not limited thereto.

In the present invention, even when an AlN film is deposited, unless it is a crystal film in which a grain boundary is not observed, the film does not work as a seed layer. Accordingly, the sapphire substrate is subjected to a special processing before depositing the AlN seed layer, whereby the AlN film formed on the wafer can be divided into portions working and not working as a seed layer. In order to allow the AlN film deposited by sputtering to work as a seed layer, the sapphire surface must be C-plane. Therefore, when the sapphire substrate is processed to create a portion that is not C-plane, the AlN film deposited in the non-C-plane region cannot grow into a C-plane crystal and in turn, does not act as a seed layer. As for the processing method to create a plane other than C-plane on the C-plane sapphire substrate surface, a photolithography technique is employed, and a region in a stripe or island/sea fashion having periodicity is selected. Examples thereof include a method of performing etching by using a chlorine-based gas such as $Cl_2$, $SiCl_4$ and $BCl_3$ and a method of performing wet etching by raising the temperature to near 200° C. Also, the plane may be either a case where the portion remaining on the C-plane after shaving off by etching is the non-C-plane and a case where the portion exposed after shaving off is the non-C-plane. Furthermore, in the case of a processing to create a simple step, the non-C-plane may be a plane at an angle of 30° or more to the C-plane. The portions which are processed or not processed by photolithography can be created with a resist. As for the normal resist material, a mixture of a novolak-type resin and a photosensitizing agent is being most widely used. The resist is used to protect the portion covered with the resist from etching, but the resist itself is also burned to a certain extent. If the selectivity that is a ratio of burned resist to the material undertaking the processing is not sufficiently ensured, the resist is burned out during the processing and the processing precision is impaired. To solve this problem, there is a method of first film-depositing a material capable of ensuring the selectivity and then designating regions in the film by photolithography. For example, in the case of etching $Al_2O_3$ with chlorine, since the selectivity of the normal novolak-type resist to chlorine is not large, an $SiO_2$ film poorly susceptible to etching with chlorine is first deposited, a novolak-type resist is used for $SiO_2$ to designate the regions, and $SiO_2$ is treated with a gas such as $CF_4$.

The resist undertakes differentiation between a portion that can be processed and a portion that cannot be processed, but when the resist is burned out during processing as described above, a boundary region is created in the portion that is halfway protected with the resist but is processed after the resist is lost. In the case where the purpose is to obtain a high-precision profile, this is improper, but for the purpose of creating a non-C-plane as in the present invention, this phenomenon can be aggressively used. That is, in the case of disposing the resist in a stripe fashion, it is envisaged that the cross-sectional shape becomes ideally trapezoidal. However, the resist starts burning from the corner part, leading to no remaining of resist at both edges, and the processed range gradually expands. When the processing conditions are adjusted to allow the resist to be substantially lost at the end of etching, the region that has been covered with the resist takes a protruded shape covered with various non-C-planes. Conversely, a recessed part surrounded by a non-C-plane can be also created. Whether a protruded part is created or a recessed part is created varies depending on the purpose. In the case of a protruded part, when the region is filled by lateral growth, a space is not produced, but in the case of a recessed part, a space is produced. In the case of directly using the element as a light-emitting device of LED or LD, the light is wasted by the space and this is not of benefit, but when a space is produced, separation is facilitated and in the case of separating the sapphire, creation of a recessed part is advantageous.

Figure 6:
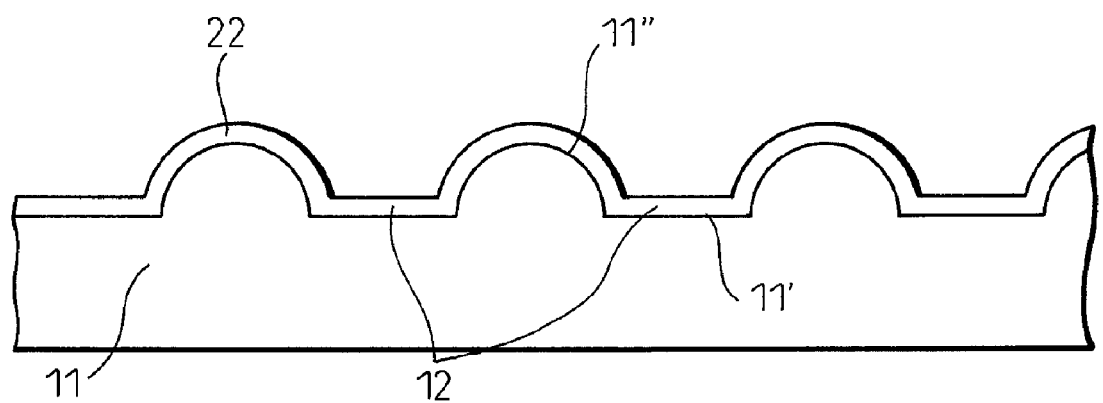
FIG. 6 is an outline view schematically showing the AlN seed layer deposited after a non-C-plane is formed in a part of the sapphire substrate by forming a protruded part.

FIG. 6 schematically shows the fact that when creating a non-C-plane (11") by forming a protruded part in a part of the sapphire substrate (11) and then depositing an AlN film on the sapphire substrate (11), an AlN seed layer (12) is formed on the C-plane (11') but a polycrystalline AlN film (22) that is a non-seed layer is formed on the non-C-plane (11").

Figure 7:
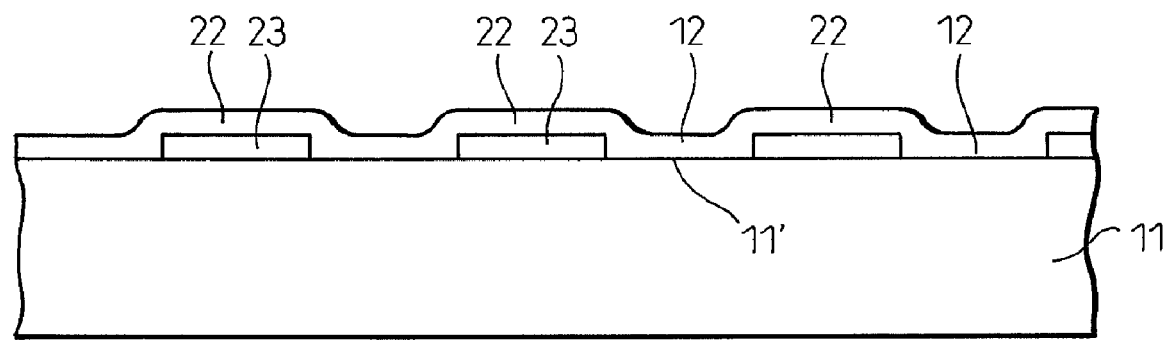
FIG. 7 is an outline view schematically showing the AlN seed layer deposited after an $SiO_2$ layer is formed on a part of the sapphire substrate.

FIG. 7 schematically shows the fact that when forming an $SiO_2$ layer (23) on a part of the sapphire substrate (11) and then depositing an AlN film on the sapphire substrate (11), an AlN seed layer (12) is formed on the C-plane (11') but a polycrystalline AlN film (22) that is a non-seed layer is formed on the $SiO_2$ layer (23).

The growth region and the region incapable of growth may also be created by using a method other than photolithography. In the case of depositing a high-melting point metal film such as Ti and Mo on the C-plane AlN or C-plane GaN surface, a polycrystal is generally formed. The reaction rate for various gases differs according to the crystal orientation, and the regions can be designated by utilizing this property. Also, the metal forming a nitride, such as Ti, utterly differs in the reactivity with the C-plane AlN or C-plane GaN according to the crystal orientation. The C-plane AlN or C-plane GaN below the created plane having high reactivity starts decomposing when heated to a high temperature. By utilizing this property, the above-described recessed portion can be produced.

In all of these cases, the crystal undergoing lateral growth is GaN or AlGaN of the underlying layer. For promoting the lateral growth, the growth conditions need to be selected to stabilize the plane other than C-plane. The conditions include those for preferentially growing a plane perpendicular to the C-plane, such as (10-10) plane and (11-20) plane, and those for preferentially growing a plane at a fixed angle to the C-plane, such as (10-11) plane, (11-21) plane and (10-12) plane. In the case where the plane at a fixed angle to the C-plane has hexagonal symmetry, the growth takes a mode of causing a six-sided pyramidal facet in a hexagonal shape as viewed from the C-plane to appear and be gradually filled. The plane which is preferentially grown can be selected, in the case of a stripe, by the direction in which the layer is shaved off by photolithography, the growth temperature during growth, the gas pressure, and the V/III ratio of raw materials. Also, when the regions are roundly designated by photolithography, the plane can be selected by the growth temperature during growth, the gas pressure, and the V/III ratio of raw materials.

On the other hand, the region disallowing epitaxial growth of the underlying layer is formed, similarly to the formation of a region disallowing growth of the seed layer, by using either one of the following methods (γ) and (δ). The epitaxial growth is suitably homoepitaxial growth of GaN or AlGaN.

(γ) The C-plane sapphire substrate surface is processed to provide a region in a stripe or island/sea fashion having periodicity and thereby form a plane other than C-plane.

(δ) A region in a stripe or island/sea fashion having periodicity is covered with amorphous $SiO_2$, amorphous silicon nitride or a high melting-point metal.

(Growth Conditions)

In the case of epitaxially growing the underlying layer by the MOCVD method on the top surface of a substrate having regions where the seed layer is present and is absent, or in the case of having a region capable of epitaxial growth and a region incapable of epitaxial growth in the underlying layer and epitaxially growing the underlying layer by the MOCVD method, the growth pressure and the growth temperature are preferably contingent on the following conditions. When the growth pressure is lowered and the growth temperature is raised, crystal growth in the lateral direction is accelerated, and when the growth pressure is raised and the growth temperature is lowered, a facet growth mode (triangular shape) results. Accordingly, when the growth pressure in the initial time of growth is raised, facet growth proceeds on the AlN crystal film seed layer, and therefore, the facet growth mode is preferably maintained until the entire surface becomes a facet. For this reason, in the case of epitaxially growing the underlying layer by the MOCVD method on the top surface of a substrate where a protruded part is formed, the growth pressure is preferably changed in 2 stages, that is, once until the film thickness of the underlying layer reaches about 2 μm or more (first half), and then after the underlying layer is stacked to a thickness of about 2 μm or more (latter half).

In the first half, the growth pressure is preferably set to 40 kPa or more, more preferably about 60 kPa. When the growth pressure is set to 40 kPa or more, a facet growth mode (triangular shape) proceeds and the dislocation is bent in the lateral direction and does not penetrate to the epitaxial surface. Accordingly, it is presumed that when the growth pressure is raised, the dislocation is reduced and the crystallinity is improved.

However, when the growth pressure is set to 40 kPa or more, a pit is readily generated in the surface of the epitaxially grown underlying layer and a sufficient surface flatness is not obtained in some cases. For this reason, in the case of setting the growth pressure to 40 kPa or more, it is more preferred to set the growth temperature to a temperature lower by 20 to 50° C. than the optimum temperature for the stable growth of C-plane. By appropriately controlling the growth temperature, generation of a pit can be sufficiently suppressed even when the growth pressure is set to 40 kPa or more, preferably about 60 kPa.

In the latter half, the growth temperature is preferably set to 40 kPa or less, more preferably about 20 kPa. When the growth pressure is et to 40 kPa or less in the latter half, the C-plane preferentially grows and the crystal growth in the lateral direction can be accelerated, as a result, an underlying layer having excellent surface flatness is obtained.

The light-emitting device of the present invention can be used not only for the above-described light-emitting device but also for a photoelectric conversion element such as laser element and light-receiving element, and an electronic device such as heterojunction bipolar transistor (HBT) and high electron mobility transistor (HEMT). A large number of such semiconductor elements having various structures are known, and the structure of the light-emitting device according to the present invention is not limited in any way, including these known element structures.

The light-emitting device of the present invention can be fabricated, for example, into a lamp by providing a transparent cover by a method known in the field. Also, a technique of changing luminescent color by combining a light-emitting device and a fluorescent material is conventionally known, and such a technique can be employed without any limitation. For example, by appropriately selecting a fluorescent material, luminescence at a longer wavelength than that of the light-emitting device can be obtained, or by mixing the luminescence wavelength of the light-emitting device itself and the wavelength converted by the fluorescent material, a lamp capable of emitting white light can also be fabricated.

As for the lamp, the light-emitting device can be used for any of lamps such as cannonball type in general use, side-view type for backlight in portable devices, and top-view type used in indicators.

The lamp fabricated from the gallium nitride-based compound semiconductor light-emitting device of the present invention has high luminous output and low driving voltage and therefore, electronic devices having incorporated thereinto the lamp fabricated by this technique, such as cellular phones, displays and panels, and mechanical devices having incorporated thereinto the electronic device, such as automobiles, computers and game machines, can be driven with a low electric power while exhibiting high characteristics. In particular, power saving occurs in battery-driven devices such as cellular phones, game machines, toys and automobile parts.

EXAMPLES

Example 1

Circular resists of 2 μm in diameter were planarly disposed at regular intervals with a center-to-center distance of 4 μm on a C-plane sapphire substrate having a diameter of 100 mm and a thickness of 0.9 mm, which was cut at an off-angle of 0.35° and whose surface roughness was Ra≦2 Å. The gas pressure was adjusted to 0.5 Pa by flowing $BCl_3$ gas and $Cl_2$ gas in a ratio of 1:1 at 100 sccm in total. The sapphire was processed at an etching rate of about 200 Å/min by adjusting the power and the bias to give a maximum rate of sapphire etching. The plane etched due to absence of the resist was C-plane, but in the portion covered with the resist, the resist was burned halfway and lost, as a result, an upward protrusion surrounded by various planes was obtained. The etching residue on the wafer subjected to the processing was washed out by thorough cleaning. The wafer was then set in a sputtering apparatus with a 5N high-purity Al target to deposit an AlN film. The target diameter was 200 mm, and the distance between the target and the sapphire substrate was 60 mm. As for the power application method in the surface plasma treatment, an RF power was applied between the sapphire substrate and the chamber. As for the power application method in the AlN film deposition, an RF power was applied between the target and the chamber. The film deposition conditions were as follows.

(Surface Plasma Treatment)

Heater temperature: 600° C., Ar flow rate: 0 sccm, $N_2$ flow rate: 75 sccm, applied power: 30 W, total gas pressure: 1.0 Pa, base pressure: $4\times10^{-6}$ Pa, TS distance: 60 mm, application time: 15 seconds.

(AlN Film Deposition)

Heater temperature: 600° C., Ar flow rate: 25 sccm, $N_2$ flow rate: 75 sccm, applied power: 1,500 W, total gas pressure: 0.5 Pa, base pressure: $4\times10^{-6}$ Pa, TS distance: 60 mm, application time: 100 seconds.

The processing was performed in two stages, that is, a surface plasma treatment to make up the surface and a treatment to deposit a film. After the completion of treatment, the wafer was taken out from the apparatus and measured by XRD. The properties of the obtained AlN film were as follows.

Oxygen concentration: 2.8 atm %, FWHM (0002): 45 arc-sec, FWHM (10-10): 1.9°.

The obtained AlN film works out to a seed layer in the region having C-plane, but in the region having a plane other than C-plane, an AlN layer corresponding to each plane grows and the film does not act as a seed layer.

This wafer partially attached with a seed layer was placed in an MOCVD furnace and an underlying layer was grown. The growth of the underlying layer was divided into a first GaN layer and a second GaN layer, and an n-type semiconductor GaN layer was grown on the underlying layer. Specific growth conditions were as follows.

(First GaN Layer (Undoped GaN))

Total gas pressure: 600 mbar; susceptor temperature: 1,080° C.; $H_2$ flow rate: 30 slm; $N_2$ flow rate: 0 slm; TMG flow rate: 80 sccm; $NH_3$ flow rate: 10 slm; $SiH_4$ flow rate: 0 sccm; GaN growth rate: 0.8 μm/hr; thickness of GaN: 2 μm.

(Second GaN Layer (Undoped GaN))

Total gas pressure: 400 mbar; susceptor temperature: 1,100° C.; $H_2$ flow rate: 30 slm; $N_2$ flow rate: 0 slm; TMG flow rate: 300 sccm; $NH_3$ flow rate: 7 slm; $SiH_4$ flow rate: 0 sccm; GaN growth rate: 2 μm/hr; thickness of GaN: 4 μm.

(n-Contact Layer (14b) (n-GaN))

Total gas pressure: 400 mbar; susceptor temperature: 1,100° C.; $H_2$ flow rate: 30 slm; $N_2$ flow rate: 0 slm; TMG flow rate: 300 sccm; $NH_3$ flow rate: 7 slm; $SiH_4$ flow rate: 120 sccm; thickness of n-GaN: 2 μm.

Trimethylgallium (TMG) that is an organometallic material was used as the Ga raw material, and ammonia ($NH_3$) was used as the N source. The carrier gas was $H_2$. The n-GaN layer was deposited while further adding a dopant. For the n-type semiconductor layer, Si was used as the dopant material, and monosilane ($SiH_4$) was used as the Si raw material. The dopant was supplied together with the carrier gas, and the concentration of the supplied dopant was controlled by the ratio to the supplied amount of TMG. After the growth, the wafer was taken out from the furnace and measured by XRD.

Furthermore, n-clad layer/MQW/p-clad layer/p-GaN were grown. The carrier gas was switched to nitrogen. Thereafter, n-type clad layer/light-emitting layer/p-type semiconductor GaN layer were grown. The n-type clad layer was interposed between the n-type semiconductor GaN layer and the light-emitting layer, and the p-type clad layer was interposed between the light-emitting layer and the p-type semiconductor GaN layer. Specific growth conditions were as follows.

(n-Clad Layer (14c))

Total gas pressure: 400 mbar; susceptor temperature: 760° C.; $H_2$ flow rate: 0 slm; $N_2$ flow rate: 50 slm; TMG flow rate: 0 sccm; TEG flow rate: 250 sccm; $NH_3$ flow rate: 18 slm; TMI flow rate: 20 sccm; $SiH_4$ flow rate: 50 sccm; $Cp_2Mg$ flow rate: 0 sccm.

(Light-Emitting Layer (15))

Total gas pressure: 400 mbar; susceptor temperature: 760/980° C.; $H_2$ flow rate: 0 slm; $N_2$ flow rate: 50 slm; TMG flow rate: 0 sccm; TEG flow rate: 150 sccm; $NH_3$ flow rate: 18 slm; TMI flow rate: 120/0 sccm; $SiH_4$ flow rate: 0/30 sccm; $Cp_2Mg$ flow rate: 0 sccm.

(p-Clad Layer (16a))

Total gas pressure: 400 mbar; susceptor temperature: 1,040° C.; $H_2$ flow rate: 30 slm; $N_2$ flow rate: 0 slm; TMG flow rate: 180 sccm; TEG flow rate: 0 sccm; TMA flow rate: 60 sccm; $NH_3$ flow rate: 21 slm; TMI flow rate: 0 sccm; $SiH_4$ flow rate: 0 sccm; $Cp_2Mg$ flow rate: 130 sccm.

(p-Contact Layer (16b))

Total gas pressure: 400 mbar; susceptor temperature: 1,040° C.; $H_2$ flow rate: 30 slm; $N_2$ flow rate: 0 slm; TMG flow rate: 180 sccm; TEG flow rate: 0 sccm; $NH_3$ flow rate: 21 slm; TMI flow rate: 0 sccm; $SiH_4$ flow rate: 0 sccm; $Cp_2Mg$ flow rate: 260 sccm.

The growth rate was 2 μm/hr in all layers.

An AlN crystal film seed layer of 25 nm, an undoped GaN underlying layer (film thickness: 6 μm), an Si-coped n-type GaN contact layer (film thickness: 2 μm), an Si-doped n-type $In_{0.01}Ga_{0.99}N$ clad layer (film thickness: 50 nm), a light-emitting layer having a multiquantum structure consisting of 6 Si-doped GaN barrier layers (film thickness: 14.0 nm) and 5 undoped $In_{0.20}Ga_{0.80}N$ well layer (film thickness: 2.5 nm), an Mg-doped p-type $Al_{0.07}Ga_{0.93}N$ clad layer (film thickness: 10 nm), and an Mg-doped p-type GaN contact layer (film thickness: 150 nm) were stacked on a substrate composed of sapphire c-plane ((0001) crystal plane) to fabricate a multilayer structure.

After vapor growth of the contact layer composed of the Mg-doped GaN layer was completed, the carrier gas was immediately switched from $H_2$ to $N_2$, and the flow rate of $NH_3$ was kept as it is. At the same time, supply of electricity to the high-frequency induction heating-type heater used for heating the substrate was stopped, and the system was left standing until the inside of the furnace reached 180° C. Thereafter, supply of $NH_3$ was stopped, and the inside of the chamber was vacuumized. After charging $N_2$, when the pressure became an atmospheric pressure, the chamber was opened and the wafer was removed therefrom.

The wafer was taken out from the MOCVD furnace and transferred to an $N_2$ plasma treatment apparatus. In a vacuum apparatus set to a base pressure of $7\times10^{-6}$ Pa, the wafer was placed on an AlN-made wafer holder and transferred from a load chamber to a transfer chamber having a robot and further to a plasma treatment chamber. The wafer was chucked in the form of tightly contacting with a PBN (pyrolytic boron nitride)-coated carbon plane heater. The material of the chuck was Mo, and the surface was coated by AlN spraying. A permanent magnet was disposed behind a surface Al plate facing the wafer with a spacing of 60 mm, and cooling water was flowed to the Al plate through piping. First, a dummy substrate was placed and chucked. A DC voltage was applied between the Al plate and the chamber, an Ar gas was introduced at 0.5 Pa to cause discharge, the Al plate surface was beaten by sputtering, and the surface was etched. Other shields were thermally floated from the chamber, and heating was performed until the dummy substrate reached 1,000° C. As a result, all shields were heated to 200° C. or more.

After taking out the dummy substrate, the GaN-based multilayer structure wafer was charged, $N_2$ was then introduced, and an RF voltage was applied between the chuck of the wafer holder and the shield to cause discharge, thereby effecting $N_2$ plasma treatment. The discharge conditions were as follows.

Temperature: 300° C., $N_2$ gas pressure: 3.0 Pa, power: 50 W, treatment time: 60 seconds.

Incidentally, the full width at half maximum of the X-ray diffraction rocking curve of the p-GaN contact layer was 48 arcsec and 140 arcsec on the (0002) plane and the (10-10) plane, respectively.

Figure 3:
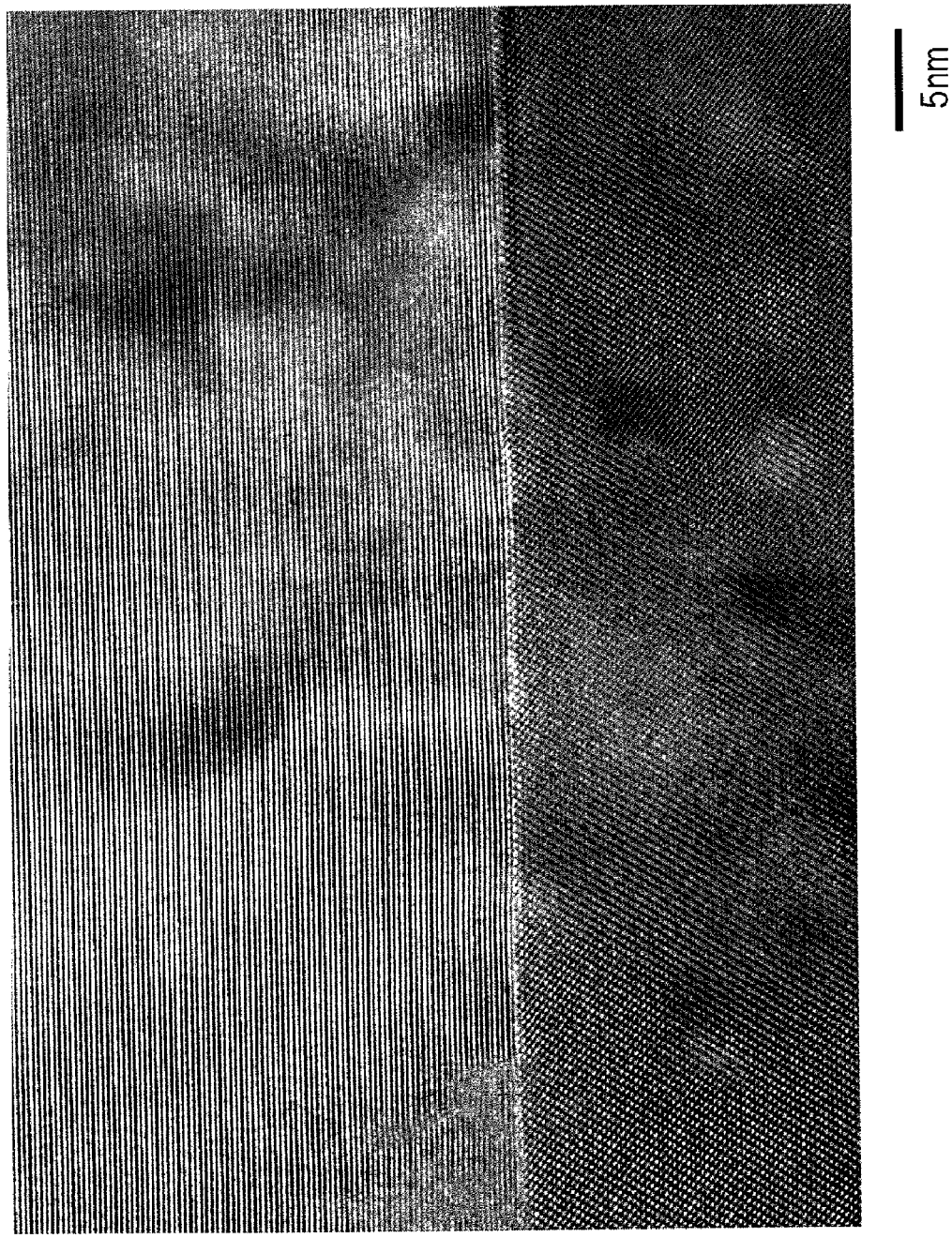
FIG. 3 is a longitudinal cross-sectional TEM photograph of the AlN seed layer obtained in Comparative Example 1 of the present invention.

Using the epitaxial multilayer structure with a p-type contact layer obtained above, an LED chip shown in FIG. 3 was produced. First, a positive electrode composed of ITO was formed on the p-type contact layer by sputtering. Through the following operations, an electrically conductive translucent oxide electrode layer composed of ITO was formed on a gallium nitride-based compound semiconductor.

An electrically conductive translucent oxide electrode layer composed of ITO was formed on the p-type GaN contact layer by using known photolithography technique and etching technique. In the formation of the electrically conductive translucent oxide electrode layer, a substrate having stacked thereon a gallium nitride-based compound semiconductor was placed in a sputtering apparatus, where an ITO film of about 2 nm was first deposited on the p-type GaN contact layer by RF sputtering and ITO of about 250 nm was then stacked by DC sputtering. The pressure during RF film deposition was set to about 0.3 Pa and the supplied power was set to 0.5 kW. The pressure during DC film deposition was set to about 0.8 Pa and the supplied power was set to 1.5 kW.

After deposition of the ITO film, the multilayer structure was subjected to annealing treatment at 500° C. for 1 minute in an air atmosphere containing 20% of oxygen.

After the completion of the annealing treatment, general dry etching was applied to the region on which a negative electrode is to be formed, and the surface of the Si-doped n-type GaN contact layer was exposed only in this region (see, FIG. 2). An $SiO_2$ protective film was deposited to 1,000 Å by RF sputtering for the purpose of protecting the chip surface. Subsequently, a hole was created by photolithography in the protective film at the portion where a pad is to be deposited, and a first layer composed of Cr (film pressure: 10 nm), a second layer composed of Pt (film thickness: 180 nm) and a third layer composed of Au (film pressure: 300 nm) were stacked in sequence by vacuum vapor deposition on a part of the ITO film layer and the exposed Si-doped n-type GaN contact layer to form a positive electrode bonding pad layer and a negative electrode, respectively.

After forming the bonding pad layer and the negative electrode, the sapphire substrate of 0.9 mm was shaved off by a grinder to a thickness as small as about 130 μm, and the back side of the sapphire substrate was further polished using an abrasive that is a diamond fine particle, and finally finished to a mirror surface. Thereafter, the multilayer structure was cut and separated into individual 350 μm square LEDs.

Subsequently, chips were bonded to a lead frame with top-view type white resin vessels of 3.5 mm (outer diameter)× 2.8 mm×1.6 mm (thickness) by using an epoxy adhesive, and the negative electrode and the positive electrode each was connected to the lead frame with a gold (Au) wire. The recess of the white resin vessel was sealed with silicone resin and after curing the resin, each vessel was separated from the lead frame and measured.

A forward current was flowed between the negative electrode and the positive electrode of the thus-fabricated LED chip mount, and the electrical characteristics and luminescence properties were evaluated. The evaluation results are shown below.

Incidentally, the values of If, Vf (1 μA), Vf (20 mA), Ir (20 V), Vr (10 μA) and Po have the following physical meanings.

If is a current value for emitting light. Vf (1 μA) is a voltage when the current is flowed in the 1 μA forward direction. This is a current value before emitting light and therefore, when leakage occurs, the value decreases in proportion. For this reason, a higher value is better. Vf (20 mA) is a so-called driving voltage and is preferably as low as possible. If the carrier concentration of the p-type semiconductor layer is not sufficiently high, ohmic contact cannot be established by p-contact and this value jumps. Ir (20 V) is a leakage current when 20 V is applied in the opposite direction, and indicates leak characteristics. This is correlated with reliability and even when the carrier concentration is increased and the luminance is raised, if this value becomes large, the reliability is unsatisfied. Vr (10 μA) is a voltage when 10 μA is flowed in the opposite direction. Unless large leakage is caused, the value is usually 20 V or more. The upper limit is 20 V and if there is no problem, 20 V is displayed. A value of less than 20 V indicates that the leakage is too large. Of course, Ir and Vr are correlated. With large Ir, VR becomes 20 V or less. However, differences in the leak characteristics among those having Vr of 20 V can be seen from the Ir value. Po is an output when 20 mA is flowed, and is an energy that can be effectively collected as light. The carrier concentration of the p-contact layer most sensitively affects Vf, but even with the same Vf, the output differs depending on the carrier concentration.

If (DC forward current): 20 mA; Vf (1 μA) (DC forward voltage): 2.33 V; Vf (20 mA) (driving voltage): 3.09 V; Ir (20 V) (DC reverse current): 0.16 μA; Vr (10 μA) (DC reverse voltage): 20 V; Po (luminous output measured with integrating sphere): 21.0 mW; λd (luminescence wavelength): 459 nm.

Incidentally, about 50,000 LEDs were obtained after removing appearance defectives from a wafer of 100 mm in diameter.

Example 2

An $SiO_2$ film of 1,000 Å was deposited on the same sapphire substrate as in Example 1 by RF sputtering using an $SiO_2$ target. Circular resists of 2 μm in diameter were caused to remain with a center-to-center distance of 4 μm through the same lithography procedure as in Example 1. $SiO_2$ in the region where the resist was not present was removed by etching using $CF_4$ gas. Thereafter, the resist was separated by spraying high-pressure NMP. The subsequent process was the same as in Example 1.

The characteristics of the obtained AlN film were as follows.

Oxygen concentration: 3 atm %, FWHM (0002): 47 arcsec, FWHM (10-10): 2.0°.

Also, the full width at half maximum of the X-ray diffraction rocking curve of the p-GaN contact layer was 53 arcsec and 160 arcsec on the (0002) plane and the (10-10) plane, respectively.

A forward current was flowed between the negative electrode and the positive electrode of an LED chip mount fabricated by the same process as in Example 1, and the electrical characteristics and luminescence properties were evaluated. The evaluation results are shown below.

If (DC forward current): 20 mA; Vf (1 LA) (DC forward voltage): 2.34 V; Vf (20 mA) (driving voltage): 3.12 V; Ir (20 V) (DC reverse current): 0.15 μA; Vr (10 μA) (DC reverse voltage): 20 V; Po (luminous output measured with integrating sphere): 20.9 mW; λd (luminescence wavelength): 460 nm.

In Examples 1 and 2, the full width at half maximum of the X-ray diffraction rocking curve in X-ray diffraction of the AlN seed crystal is not good. This is because the substrate was processed or an $SiO_2$ mask was attached to the surface, allowing many planes other than C-plane of AlN to appear, and the half-width was seen as being broadened due to the picking-up of those planes.

Example 3

An AlN crystal film was deposited as a seed layer on the entire surface of the same sapphire substrate as in Example 1 under the same conditions as in Example 1. Thereafter, the same photolithography as in Example 1 except for reversing positive and negative of the resist was performed, whereby the resist was planarly lost as circles of 2 μm in diameter at regular intervals with a center-to-center distance of 4 μm. The substrate was then placed in a dry etching apparatus, and AlN was removed through etching by introducing $Cl_2$ gas at 100 sccm and setting the total pressure to 0.5 Pa. The etching rate was 50 Å/min. Subsequently, the remaining resist was removed with high-pressure NMP (N-methylpyrrolidone). Furthermore, the etching residue was thoroughly cleaned. The subsequent process was the same as in Example 1.

The characteristics of the obtained AlN film were as follows.

Oxygen concentration: 3.1 atm %, FWHM (0002): 45 arcsec, FWHM (10-10): 1.5°.

Also, the full width at half maximum of the X-ray diffraction rocking curve of the p-GaN contact layer was 53 arcsec and 150 arcsec on the (0002) plane and the (10-10) plane, respectively.

A forward current was flowed between the negative electrode and the positive electrode of an LED chip mount fabricated by the same process as in Example 1, and the electrical characteristics and luminescence properties were evaluated. The evaluation results are shown below.

If (DC forward current): 20 mA; Vf (1 μA) (DC forward voltage): 2.34 V; Vf (20 mA) (driving voltage): 3.12 V; Ir (20 V) (DC reverse current): 0.13 μA; Vr (10 μA) (DC reverse voltage): 20 V; Po (luminous output measured with integrating sphere): 20.8 mW; λd (luminescence wavelength): 460 nm.

Example 4

An AlN crystal film was deposited as a seed layer on the entire surface of the same sapphire substrate as in Example 1 under the same conditions as in Example 1. Thereafter, GaN of 3 μm was grown under the same conditions as in the growth of the second GaN underlying layer of Example 1. The surface of this GaN underlying layer was subjected to the same photolithography as in Example 1 to cause circular resists of 2 μm in diameter to remain with a center-to-center distance of 4 μm. The wafer was placed in a dry etching apparatus, and etching was performed under the same conditions as in Example 3 by introducing $Cl_2$ gas. The shape of the upward protrusion remaining after etching can be changed by varying the resist thickness. The thickness was adjusted to give substantially semispherical protrusions. More specifically, the thickness was adjusted such that the resist was almost burned and lost at the end of etching. The subsequent process was the same as in Example 1 except that the thickness of the second GaN underlying layer was 3 μm. The characteristics of the obtained AlN film were as follows.

Oxygen concentration: 2.9 atm %, FWHM (0002): 47 arcsec, FWHM (10-10): 1.5°.

Also, the full width at half maximum of the X-ray diffraction rocking curve of the p-GaN contact layer was 59 arcsec and 120 arcsec on the (0002) plane and the (10-10) plane, respectively.

A forward current was flowed between the negative electrode and the positive electrode of an LED chip mount fabricated by the same process as in Example 1, and the electrical characteristics and luminescence properties were evaluated. The evaluation results are shown below.

If (DC forward current): 20 mA; Vf (1 μA) (DC forward voltage): 2.31 V; Vf (20 mA) (driving voltage): 3.06 V; Ir (20 V) (DC reverse current): 0.14 μA; Vr (10 μA) (DC reverse voltage): 20 V; Po (luminous output measured with integrating sphere): 21.5 mW; λd (luminescence wavelength): 460 nm.

Example 5

An AlN crystal film was deposited as a seed layer on the entire surface of the same sapphire substrate as in Example 1 under the same conditions as in Example 1. Thereafter, GaN of 3 μm was grown under the same conditions as in the growth of the first GaN underlying layer of Example 1. On the surface thereof, an SiO$_2$ film of 1,000 Å was deposited by RF sputtering using an SiO$_2$ target. Similarly to Example 2, the SiO$_2$ film was caused to remain as circles of 2 μm in diameter with a center-to-center distance of 4 μm. The subsequent process was the same as in Example 1 except that the thickness of the second GaN underlying layer was 3 μm.

The characteristics of the obtained AlN film were as follows.

Oxygen concentration: 2.9 atm %, FWHM (0002): 35 arcsec, FWHM (10-10): 1.5°.

Also, the full width at half maximum of the X-ray diffraction rocking curve of the p-GaN contact layer was 45 arcsec and 134 arcsec on the (0002) plane and the (10-10) plane, respectively.

A forward current was flowed between the negative electrode and the positive electrode of an LED chip mount fabricated by the same process as in Example 1, and the electrical characteristics and luminescence properties were evaluated. The evaluation results are shown below.

If (DC forward current): 20 mA; Vf (1 μA) (DC forward voltage): 2.34 V; Vf (20 mA) (driving voltage): 3.05 V; Ir (20 V) (DC reverse current): 0.08 μA; Vr (10 μA) (DC reverse voltage): 20 V; Po (luminous output measured with integrating sphere): 20.8 mW; λd (luminescence wavelength): 460 nm.

Example 6

An AlN crystal film was deposited as a seed layer on the entire surface of the same sapphire substrate as in Example 1 under the same conditions as in Example 1. Thereafter, GaN of 3 μm was grown under the same conditions as in the growth of the first GaN underlying layer of Example 1. The surface of this GaN underlying layer was subjected to the same photolithography treatment as in Example 4 except for reversing positive and negative of the resist, whereby circular resists of 0.5 μm in diameter were dissolved out with a center-to-center distance of 4 μm. The wafer was then placed in a dry etching apparatus, and etching was performed by introducing Cl$_2$ gas under the same conditions as in Example 4 to obtain upward protrusions remaining after etching. The subsequent process was the same as in Example 1 except that the thickness of the second GaN underlying layer was 3 μm. The characteristics of the obtained AlN film were as follows.

Oxygen concentration: 3.4 atm %, FWHM (0002): 36 arcsec, FWHM (10-10): 1.5°.

Also, the full width at half maximum of the X-ray diffraction rocking curve of the p-GaN contact layer was 46 arcsec and 118 arcsec on the (0002) plane and the (10-10) plane, respectively.

A forward current was flowed between the negative electrode and the positive electrode of an LED chip mount fabricated by the same process as in Example 1, and the electrical characteristics and luminescence properties were evaluated. The evaluation results are shown below.

If (DC forward current): 20 mA; Vf (1 μA) (DC forward voltage): 2.34 V; Vf (20 mA) (driving voltage): 3.02 V; Ir (20 V) (DC reverse current): 0.07 μA; Vr (10 μA) (DC reverse voltage): 20 V; Po (luminous output measured with integrating sphere): 21.8 mW; λd (luminescence wavelength): 459 nm.

Comparative Example 1

A Group III nitride semiconductor multilayer structure was fabricated by the same method as Example 1 except that the processing of forming a upward protrusion was not performed on the C-plane sapphire substrate surface and only the second GaN layer (undoped GaN) was film-deposited (thickness: 6 μm) as the underlying layer. The characteristics of the obtained AlN film were as follows.

Ra: 1.2 Å, oxygen concentration: 2.8 atm %, FWHM (0002): 31 arcsec, FWHM (10-10): 1.4°.

Figure 4:
FIG. 4 is a planar TEM photograph of the AlN seed layer obtained in Comparative Example 1 of the present invention.

FIGS. 3 and 4 show a longitudinal cross-sectional TEM photograph and a planar TEM photograph, respectively, of the obtained seed layer (12) of AlN crystal film. As for two layers seen in FIG. 3, the lower layer indicates the sapphire substrate and the upper layer indicates the AlN crystal film seed layer. The visual field of FIG. 3 was about 60 nm and even when 4 visual fields were observed by shifting the position, difference in the density of the lattice image was not recognized and a crystal grain boundary was not observed. In FIG. 4, the visual field was 50 nm×60 nm, and a 200 nm-square region was observed by shifting the position little by little, as a result, a crystal grain boundary corresponding to a columnar crystal could not be observed.

Also, the full width at half maximum of the X-ray diffraction rocking curve of the p-GaN contact layer was 45 arcsec and 215 arcsec on the (0002) plane and (10-10) plane, respectively.

A forward current was applied between the negative electrode and the positive electrode of an LED chip mount fabricated by the same process as in Example 1, and the electrical characteristics and luminescence properties were evaluated. The evaluation results are shown below.

If (DC forward current): 20 mA; Vf (1 μA) (DC forward voltage): 2.34 V; Vf (20 mA) (driving voltage): 3.03 V; Ir (20 V) (DC reverse current): 0.06 μA; Vr (10 μA) (DC reverse voltage): 20 V; Po (luminous output measured with integrating sphere): 20.5 mW; λd (luminescence wavelength): 459 nm.

Comparative Example 2

A Group III nitride semiconductor multilayer structure was fabricated by the same method as Example 1 except for not depositing an AlN film.

The full width at half maximum of the X-ray diffraction rocking curve of the p-GaN contact layer was 589 arcsec on the (0002) plane, but (10-10) could not be measured.

A forward current was applied between the negative electrode and the positive electrode of an LED chip mount fabricated by the same process as in Example 1, and the electrical characteristics and luminescence properties were evaluated. The evaluation results are shown below.

If (DC forward current): 20 mA; Vf (1 μA) (DC forward voltage): 1.89 V; Vf (20 mA) (driving voltage): 4.38 V; Ir (20 V) (DC reverse current): 8.24 μA; Vr (10 μA) (DC reverse voltage): 20 V; Po (luminous output measured with integrating sphere): 2.7 mW; λd (luminescence wavelength): 473 nm.

INDUSTRIAL APPLICABILITY

According to the present invention, an AlN crystal film seed layer having high crystallinity is combined with selective/lateral growth, whereby a Group III nitride semiconductor multilayer structure more enhanced in the crystallinity can be obtained.

DESCRIPTION OF NUMERICAL REFERENCES

1 Light-emitting device
10 Group III nitride semiconductor multilayer structure
11 Sapphire substrate
12 Seed layer
14 n-Type semiconductor layer
15 Light-emitting layer
16 p-Type semiconductor layer
17 Translucent positive electrode
18 Positive electrode bonding pad
19 Negative electrode bonding pad
20 Groups III nitride semiconductor layer
21 Resist layer
22 Polycrystalline AlN layer
23 $SiO_2$ layer

The invention claimed is:

1. A production method of a Group III nitride semiconductor multilayer structure, comprising producing a Group III nitride semiconductor multilayer structure where an AlN crystal film having a crystal grain boundary interval of 200 nm or more is formed as a seed layer on a C-plane sapphire substrate surface by a sputtering method and an underlying layer, an n-type semiconductor layer, a light-emitting layer and a p-type semiconductor layer, each composed of a Group III nitride semiconductor, are further stacked, wherein (A) regions in which said seed layer is present and is absent are formed on said C-plane sapphire substrate surface and/or (B) regions capable of epitaxial growth and incapable of epitaxial growth are formed in said underlying layer.

2. The method for producing a Group III nitride semiconductor multilayer structure as claimed in claim 1, wherein the seed layer-free region on the C-plane sapphire substrate surface is formed in a stripe or island/sea fashion having periodicity.

3. The method for producing a Group III nitride semiconductor multilayer structure as claimed in claim 1, wherein the seed layer-free region on the C-plane sapphire substrate surface is obtained by growing an AlN crystal film as a seed layer on the C-plane sapphire substrate layer and then removing by etching a part of the AlN crystal film.

4. The method for producing a Group III nitride semiconductor multilayer structure as claimed in claim 1, wherein the seed layer-free region on the C-plane sapphire substrate surface is obtained by forming regions allowing and disallowing the seed layer of the C-plane to grow on the sapphire substrate surface and then growing an AlN crystal film as a seed layer only in the region allowing growth of the seed layer.

5. The method for producing a Group III nitride semiconductor multilayer structure as claimed in claim 4, wherein the region disallowing growth of the seed layer is formed using either one of the following methods (α) and (β):

(α) said C-plane sapphire substrate surface is processed to provide a region in a stripe or island/sea fashion having periodicity and thereby form a plane other than C-plane, and (β) a region in a stripe or island/sea fashion having periodicity is covered with amorphous $SiO_2$, amorphous silicon nitride or a high melting-point metal.

6. The method for producing a Group III nitride semiconductor multilayer structure as claimed in claim 1, wherein the region incapable of epitaxial growth in the underlying layer is formed by either one of the following methods (γ) and (δ):

(γ) said C-plane sapphire substrate surface is processed to provide a region in a stripe or island/sea fashion having periodicity and thereby form a plane other than C-plane, and (δ) a region in a stripe or island/sea fashion having periodicity is covered with amorphous $SiO_2$, amorphous silicon nitride or a high melting-point metal.

7. The method for producing a Group III nitride semiconductor multilayer structure as claimed in claim 1, wherein the full width at half maximum of the X-ray diffraction rocking curve of the (0002) plane and (10-10) of the AlN crystal film are 100 arcsec or less and 1.7° or less, respectively.

8. The method for producing a Group III nitride semiconductor multilayer structure as claimed in claim 1, wherein the AlN crystal film is formed by controlling the oxygen content in the AlN crystal film to be 5 atm % or less.

9. The method for producing a Group III nitride semiconductor multilayer structure as claimed in claim 1, wherein the sapphire substrate has an off-angle of 0.1 to 0.7°.

10. The method for producing a Group III nitride semiconductor multilayer structure as claimed in claim 1, wherein the sputtering method is an RF sputtering method.

11. The method for producing a Group III nitride semiconductor multilayer structure as claimed in claim 1, wherein the AlN crystal film is deposited by a sputtering method by placing the sapphire substrate in plasma.

12. The method for producing a Group III nitride semiconductor multilayer structure as claimed in claim 1, wherein an AlN crystal film having an oxygen content of 5 atm % or less is formed by forming the AlN crystal film under conditions in which a peak assigned to oxygen is not recognized in gas analysis during plasma discharge.

13. The method for producing a Group III nitride semiconductor multilayer structure as claimed in claim 1, wherein the sapphire substrate surface is subjected to an $N_2$ plasma or $O_2$ plasma treatment and then the AlN single crystal film is deposited on said sapphire substrate surface.

14. The method for producing a Group III nitride semiconductor multilayer structure as claimed in claim 1, wherein the substrate temperature during deposition of the AlN crystal film on the sapphire substrate surface is from 300 to 800° C.

15. The method for producing a Group III nitride semiconductor multilayer structure as claimed in claim 1, wherein the thickness of the AlN crystal film is from 10 to 50 nm.

16. The method for producing a Group III nitride semiconductor multilayer structure as claimed in claim 1, wherein the thickness of the AlN crystal film is from 25 to 35 nm.

17. The method for producing a Group III nitride semiconductor multilayer structure as claimed in claim 1, wherein the diameter of the sapphire substrate is 100 mm or more.

* * * * *